US009311435B2

(12) United States Patent
Holloway et al.

(10) Patent No.: US 9,311,435 B2
(45) Date of Patent: Apr. 12, 2016

(54) METHOD FOR DETERMINING A CUT FOR A GEMSTONE

(75) Inventors: Garry Holloway, Canterbury (AU); Janak A. Mistry, Surat (IN); Roman Sergeevich Serov, Oblast (RU); Sergey Borisovich Sivovolenko, Tampere (FI); Yuri Borisovich Shelementiev, Moscow (RU); Alexander Viktorovich Medvedev, Ryazan (RU)

(73) Assignee: OCTONUS DIA-TECH PRIVATE LTD., Sagrampura Surat (IN)

( * ) Notice: Subject to any disclaimer, the term of this patent is extended or adjusted under 35 U.S.C. 154(b) by 190 days.

(21) Appl. No.: 13/997,687

(22) PCT Filed: Mar. 20, 2012

(86) PCT No.: PCT/IB2012/051323
§ 371 (c)(1),
(2), (4) Date: Oct. 14, 2013

(87) PCT Pub. No.: WO2012/164410
PCT Pub. Date: Dec. 6, 2012

(65) Prior Publication Data
US 2014/0033765 A1    Feb. 6, 2014

(30) Foreign Application Priority Data

May 27, 2011   (EP) ..................................... 11167969
Jul. 14, 2011   (BE) ................................... 2011/0452

(51) Int. Cl.
*G06T 17/10*     (2006.01)
*A44C 17/00*    (2006.01)
(Continued)

(52) U.S. Cl.
CPC .......... *G06F 17/5009* (2013.01); *A44C 17/001* (2013.01); *B24B 9/16* (2013.01); *B28D 5/00* (2013.01); *G06T 17/00* (2013.01)

(58) Field of Classification Search
CPC .......... B24B 9/16; B28D 5/00; B28D 5/0058; B28D 5/0064; B28D 5/02; B28D 5/04; G06F 17/00; G06F 17/50; G06T 17/00; G06T 17/10; G01N 21/87; A44C 17/00; A44C 17/001
USPC ................... 451/41, 57, 70; 125/30.01; 63/32
See application file for complete search history.

(56) References Cited

U.S. PATENT DOCUMENTS 8,342,164 B2 *   1/2013  Linares ................ A44C 17/001
                                                            125/30.01
2002/0170315 A1  11/2002  Mardkha
(Continued)

FOREIGN PATENT DOCUMENTS

WO     2006/087702 A1    8/2006

OTHER PUBLICATIONS

International Search Report mailed Sep. 13, 2012 (PCT/IB2012/051323); ISA/EP.

*Primary Examiner* — Eileen Morgan
(74) *Attorney, Agent, or Firm* — Banner & Witcoff, Ltd.

(57) ABSTRACT

Method for determining a cut for a gemstone, comprising selecting a generic shape for the cut; selecting a plurality of cut designs of a group of cut designs having the selected generic shape; simulating a number of optical metrics for the plurality of cut designs using simulation models having modeling coefficients; selecting one or more cut designs of the plurality of cut designs based on the simulated optical metrics; varying the geometry parameters for each selected cut design within a range, simulating a number of optical metrics for said range of geometry parameters, and determining an optimized cut design having optimized geometry parameters based on the simulated number of optical metrics for said range; cutting and polishing of the gemstone using the optimized cut design having the optimized geometry parameters; analyzing the visual appearance of the polished gemstone; changing or adapting the simulation models and/or the modeling coefficients thereof and/or the range for varying the geometry parameters and/or a cut design of the plurality of cut designs, and/or adding one or more new cut designs to the group of cut designs, on the basis of the analysis of the visual appearance.

15 Claims, 20 Drawing Sheets

| Cut name | Office, Black Background | ASET White | Intensity weighted dispersion (In ring) | Cushion Size Normalized by Square | | | | |
|---|---|---|---|---|---|---|---|---|
| | | | | Light Return Whole Crown Static | ETAS Fire Whole Crown Static | ETAS Fire Table only Static | ETAS Monochrome Whole Crown Static | DETAS Whole Crown Static |
| MSS Cushion 4 Symmetrical Model | | | | 1,06 | 1,09 | 1,06 | 1,29 | 1,35 |
| MSS Cushion 4 Scanned Real Model | | | | 1,05 | 1,09 | 0,82 | 1,27 | 1,30 |

(51) Int. Cl.
*B24B 9/16* (2006.01)
*B28D 5/00* (2006.01)
*G06F 17/50* (2006.01)
*G06T 17/00* (2006.01)

(56) References Cited

U.S. PATENT DOCUMENTS

2003/0192346 A1* 10/2003 Samuels .............. A44C 17/001
 63/32
2006/0074588 A1 4/2006 Blodgett et al.
2007/0113586 A1 5/2007 Rydlewicz
2010/0059034 A1* 3/2010 Linares ................ A44C 17/001
 125/30.01
2010/0250201 A1* 9/2010 Sivovolenko .......... G01N 21/87
 703/1
2012/0297826 A1* 11/2012 Husar .................. A44C 17/001
 63/32
2014/0107986 A1* 4/2014 Sivovolenko .......... G01N 21/87
 703/1

* cited by examiner

| Cushion | N | Cа | Pa | Light Return | ETAS Fire | Photoreal (Offset) |
|---|---|---|---|---|---|---|
| | 1 | 35 | 41 | 0,73 | 0,63 | |
| PM4_PG4_PH16_C32 | 2 | 32 | 41,5 | 0,81 | 0,45 | |
| | 3 | 36 | 40,5 | 0,75 | 0,61 | |
| PM4_PG8_PH16_C32_Flat | 1 | 36 | 43 | 0,83 | 0,42 | |
| | 1 | 35 | 41,5 | 0,82 | 0,66 | |
| PM4_PG8_PH16_C32_Strong | 2 | 36 | 41 | 0,85 | 0,63 | |
| | 3 | 33 | 42 | 0,88 | 0,61 | |
| PM4_PG8_PH16_Pbrill_C32 | 1 | 32 | 42 | 0,68 | 0,54 | |
| | 2 | 33 | 41,5 | 0,68 | 0,44 | |
| PM4_PG8_PH24_C32 | 1 | 36 | 43,5 | 0,82 | 0,39 | |
| | 2 | 32 | 43,5 | 0,69 | 0,39 | |
| PM4_PG8_PH24_Pbrill_C32 | 1 | 32 | 42 | 0,65 | 0,40 | |
| | 2 | 36 | 43 | 0,60 | 0,41 | |
| Cushion.P32 C32B | 1 | 34 | 41 | 1,01 | 0,76 | |
| | 2 | 35 | 41 | 0,95 | 0,79 | |
| | 3 | 31 | 41,5 | 1,04 | 0,70 | |

| Cushion | N | Cа | Pa | Light Return | ETAS Fire | Photoreal (Office) |
|---|---|---|---|---|---|---|
| | 1 | 33 | 36 | 1,04 | 0,70 | |
| CushionP | 2 | 31,5 | 36 | 0,99 | 0,72 | |
| | 3 | 31,5 | 38,5 | 1,05 | 0,65 | |
| Rhino ASC | 1 | | | 0,57 | 0,64 | |
| | 2 | | | 0,65 | 0,52 | |
| Cushion.P24 C32B | 1 | 34 | 38 | 0,97 | 0,98 | |
| | 2 | 35 | 37,5 | 0,89 | 1,02 | |
| Cushion.P28 C32B | 1 | 36 | 37,5 | 0,89 | 0,92 | |
| | 2 | 33,5 | 38 | 0,99 | 0,74 | |
| Cushion | 1 | 34,5 | 37,5 | 0,96 | 0,85 | |
| | 2 | 34 | 37,5 | 0,96 | 0,82 | |
| Cushion.P36 C32 | 1 | 31 | 38 | 0,85 | 0,61 | |
| | 2 | 36 | 40,5 | 0,84 | 0,38 | |
| PM4_PG16_PH24_C32 | 1 | 34,5 | 43,5 | 0,94 | 0,60 | |
| | 2 | 34 | 42,5 | 0,98 | 0,46 | |

FIGURE 5

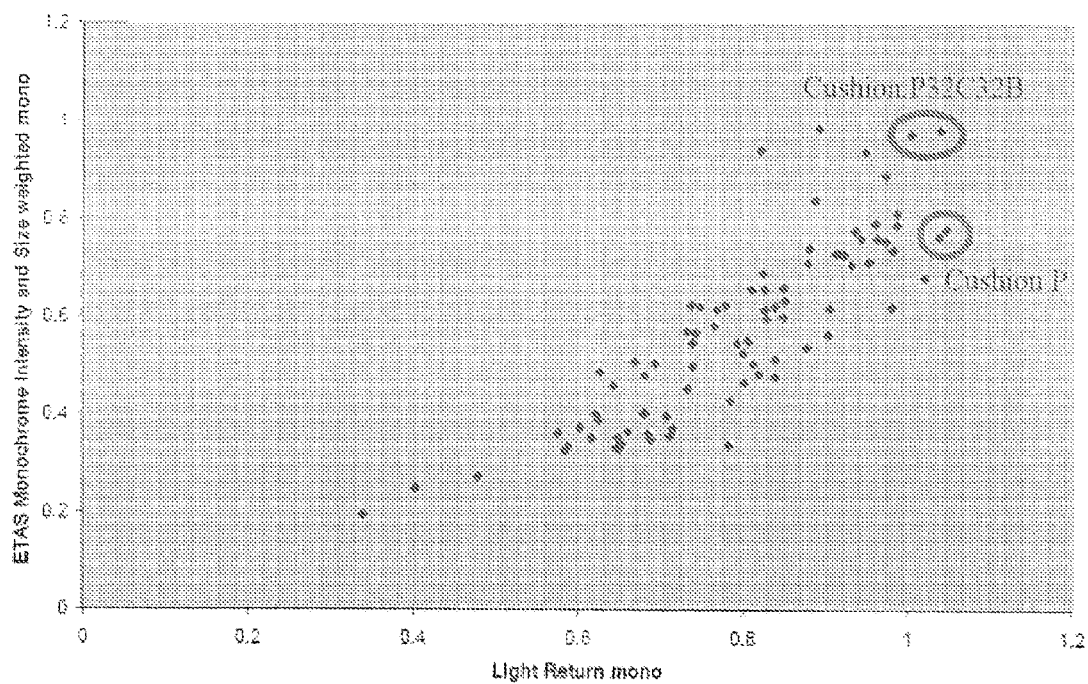
FIGURE 6
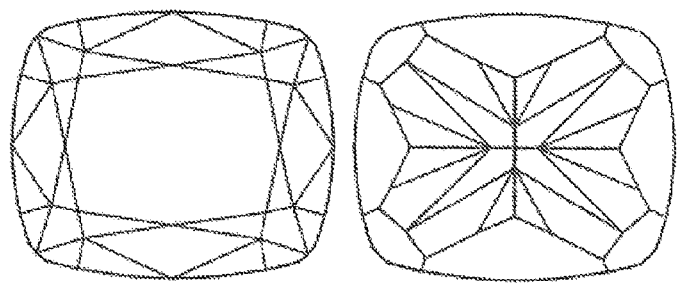
Cushion New
(CushionP.dll)
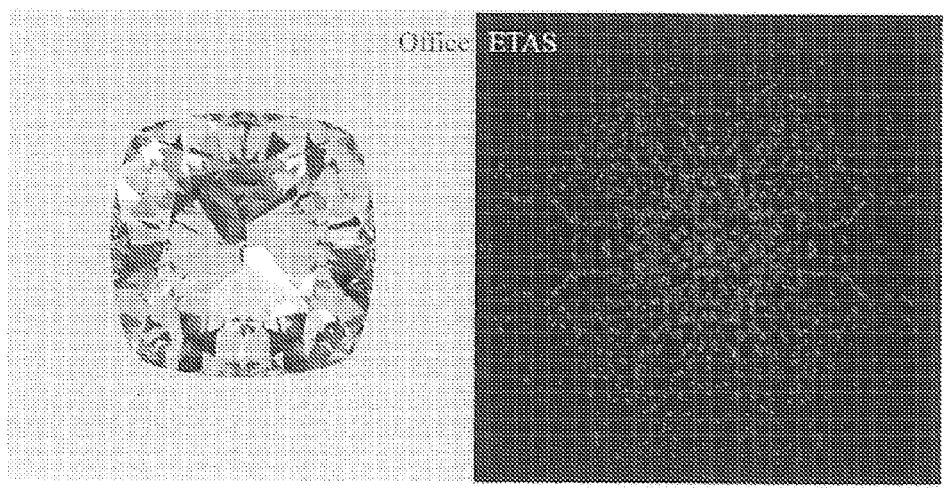
FIGURE 7

FIGURE 16

| Cut name | For 1 carat stones Office, Black Background | ASET White | (heavily weighted description in img) | (dev) | Light Return Whole Crown Static | Cushion Size Normalized by Square | | | | Cushion Size Normalized by Weight | | | |
|---|---|---|---|---|---|---|---|---|---|---|---|---|---|
| | | | | | | ETAS Fire Whole Crown Static | ETAS Fire Table only Static | ETAS Monochrome Whole Crown Static | DETAS Whole Crown Static | ETAS Fire Whole Crown Static | ETAS Fire Table only Static | ETAS Monochrome Whole Crown Static | DETAS Whole Crown Static |
| MSS Cushion 1 | | | | | 0.96 | 1.04 | 0.95 | 1.05 | 1.10 | 0.92 | 0.88 | 0.97 | 1.02 |
| MSS Cushion 2 | | | | | 1.11 | 1.01 | 0.83 | 1.15 | 1.22 | 0.92 | 0.76 | 1.07 | 1.15 |
| MSS Cushion 3 | | | | | 1.08 | 0.95 | 0.90 | 1.09 | 1.09 | 0.89 | 0.86 | 1.04 | 1.05 |
| MSS Cushion 4 | | | | | 1.06 | 1.09 | 1.06 | 1.29 | 1.35 | 0.98 | 0.95 | 1.18 | 1.25 |
| MSS Cushion 5 | | | | | 1.09 | 1.04 | 1.10 | 1.31 | 1.36 | 0.93 | 0.98 | 1.18 | 1.24 |
| MSS Cushion 6 | | | | | 1.01 | 1.38 | 1.79 | 1.11 | 1.22 | 1.24 | 1.65 | 1.02 | 1.13 |
| MSS Cushion 7 | | | | | 1.04 | 1.59 | 1.30 | 0.95 | 1.55 | 1.48 | 1.22 | 0.89 | 1.45 |

FIGURE 17

| Cut name | For 10 carat stones Office, Black Background | ASET White | (heavily weighted description in img) | (dev) | Light Return Whole Crown Static | Cushion Size Normalized by Square | | | | Cushion Size Normalized by Weight | | | |
|---|---|---|---|---|---|---|---|---|---|---|---|---|---|
| | | | | | | ETAS Fire Whole Crown Static | ETAS Fire Table only Static | ETAS Monochrome Whole Crown Static | DETAS Whole Crown Static | ETAS Fire Whole Crown Static | ETAS Fire Table only Static | ETAS Monochrome Whole Crown Static | DETAS Whole Crown Static |
| MSS Cushion 1 | | | | | 0.96 | 1.16 | 0.88 | 1.00 | 1.05 | 1.11 | 0.92 | 0.93 | 1.01 |
| MSS Cushion 2 | | | | | 1.11 | 1.14 | 0.95 | 1.08 | 1.11 | 1.08 | 0.90 | 1.03 | 1.04 |
| MSS Cushion 3 | | | | | 1.08 | 1.02 | 1.09 | 1.06 | 0.98 | 0.98 | 1.04 | 1.02 | 0.93 |
| MSS Cushion 4 | | | | | 1.06 | 1.17 | 1.19 | 1.21 | 1.15 | 1.09 | 1.12 | 1.13 | 1.07 |
| MSS Cushion 5 | | | | | 1.09 | 1.23 | 1.39 | 1.21 | 1.22 | 1.14 | 1.29 | 1.12 | 1.12 |
| MSS Cushion 6 | | | | | 1.01 | 1.52 | 2.01 | 1.05 | 1.62 | 1.39 | 1.80 | 0.98 | 1.46 |
| MSS Cushion 7 | | | | | 1.04 | 1.57 | 1.30 | 0.91 | 1.46 | 1.46 | 1.23 | 0.85 | 1.37 |

For 1 carat stones (Stereo Tilting)

| Cut name | Office: Black Background | ASET White | Intensity weighted dispersion (no rings) | Spread | Light Return Whole Crown Stereo Tilting | Cushion Size Normalized by Square ||| Cushion Size Normalized by Weight |||
|---|---|---|---|---|---|---|---|---|---|---|---|
| | | | | | | ETAS Fire Whole Crown Stereo Tilting | ETAS Fire Table Only Stereo Tilting | ETAS Monochrome Whole Crown Stereo Tilting | ETAS Fire Whole Crown Stereo Tilting | ETAS Fire Table Only Stereo Tilting | ETAS Monochrome Whole Crown Stereo Tilting |
| MSS Cushion 1 | | | | -32% | 0.92 | 0.88 | 0.76 | 0.97 | 0.82 | 0.71 | 0.91 |
| MSS Cushion 2 | | | | -17% | 0.95 | 0.85 | 0.68 | 0.97 | 0.81 | 0.64 | 0.92 |
| MSS Cushion 3 | | | | -12% | 0.97 | 0.82 | 0.89 | 0.95 | 0.79 | 0.85 | 0.91 |
| MSS Cushion 4 | | | | -21% | 0.97 | 0.89 | 1.00 | 1.04 | 0.83 | 0.93 | 0.98 |
| MSS Cushion 5 | | | | -27% | 0.94 | 0.89 | 1.01 | 0.99 | 0.81 | 0.92 | 0.92 |
| MSS Cushion 6 | | | | -23% | 0.93 | 0.92 | 1.21 | 0.90 | 0.85 | 1.12 | 0.84 |
| MSS Cushion 7 | | | | -20% | 0.91 | 1.12 | 1.11 | 0.93 | 1.05 | 1.04 | 0.88 |

FIGURE 18

For 1 carat stones (integral)

| Cut name | Office: Black Background | ASET White | Intensity weighted dispersion (no rings) | Spread | Light Return Integral | Cushion Size Normalized by Square ||| Cushion Size Normalized by Weight |||
|---|---|---|---|---|---|---|---|---|---|---|---|
| | | | | | | ETAS Fire Integral | ETAS Monochrome Integral | DETAS Integral | ETAS Fire Integral | ETAS Monochrome Integral | DETAS Integral |
| MSS Cushion 1 | | | | -32% | 0.94 | 0.93 | 1.03 | 1.03 | 0.87 | 0.96 | 0.97 |
| MSS Cushion 2 | | | | -17% | 1.09 | 0.93 | 1.09 | 1.15 | 0.88 | 1.04 | 1.10 |
| MSS Cushion 3 | | | | -12% | 1.06 | 0.90 | 1.07 | 1.08 | 0.86 | 1.03 | 1.04 |
| MSS Cushion 4 | | | | -21% | 1.04 | 1.01 | 1.18 | 1.23 | 0.95 | 1.11 | 1.17 |
| MSS Cushion 5 | | | | -27% | 1.00 | 1.01 | 1.09 | 1.14 | 0.92 | 1.01 | 1.06 |
| MSS Cushion 6 | | | | -23% | 0.99 | 1.22 | 1.10 | 1.22 | 1.13 | 1.03 | 1.15 |
| MSS Cushion 7 | | | | -20% | 1.01 | 1.26 | 0.93 | 0.98 | 1.18 | 0.87 | 0.92 |

FIGURE 19

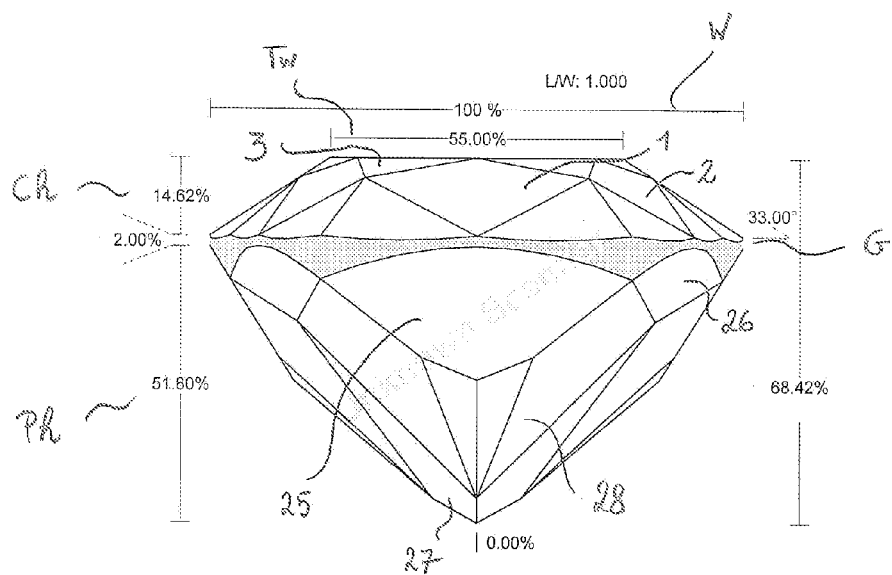
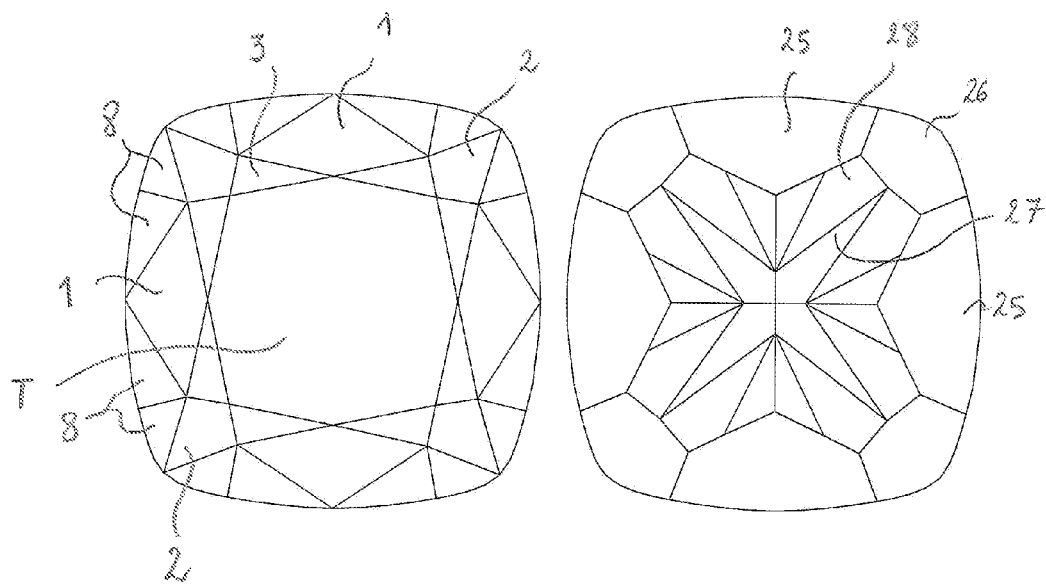
FIGURE 24

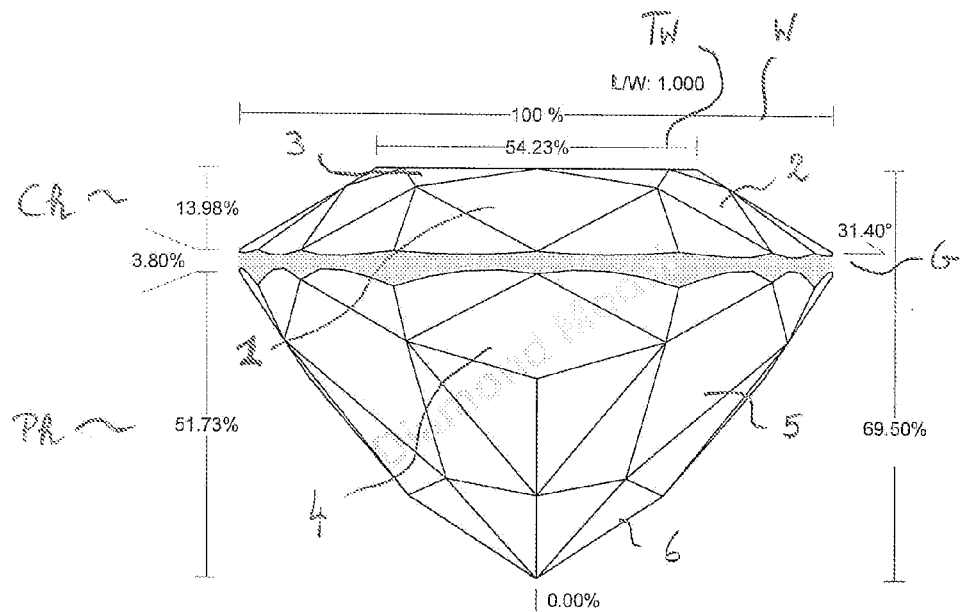
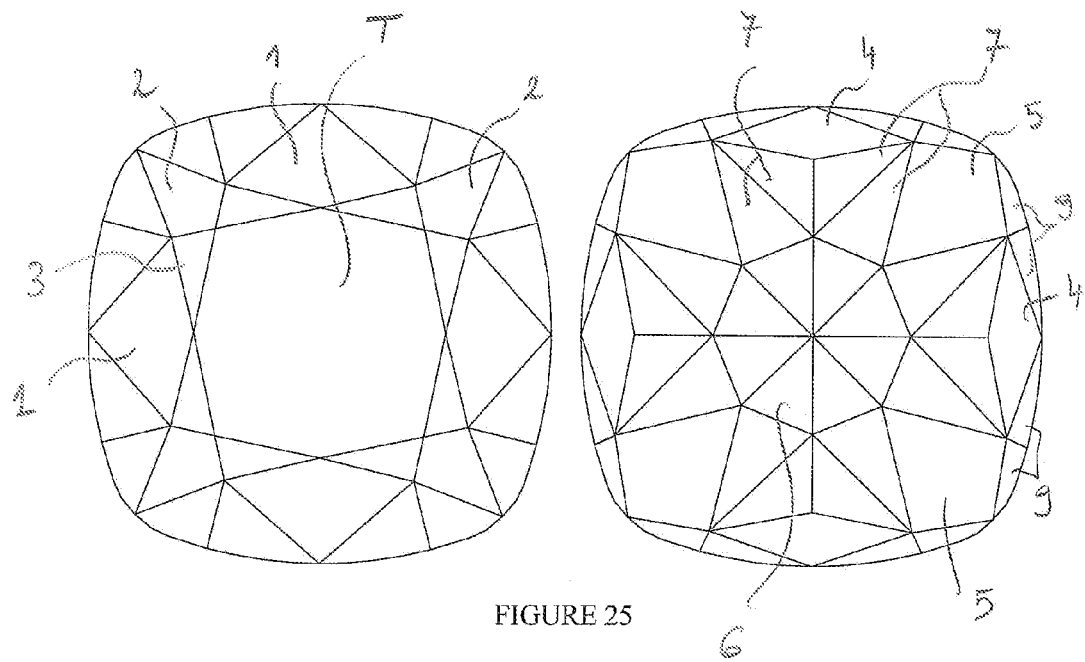
FIGURE 25

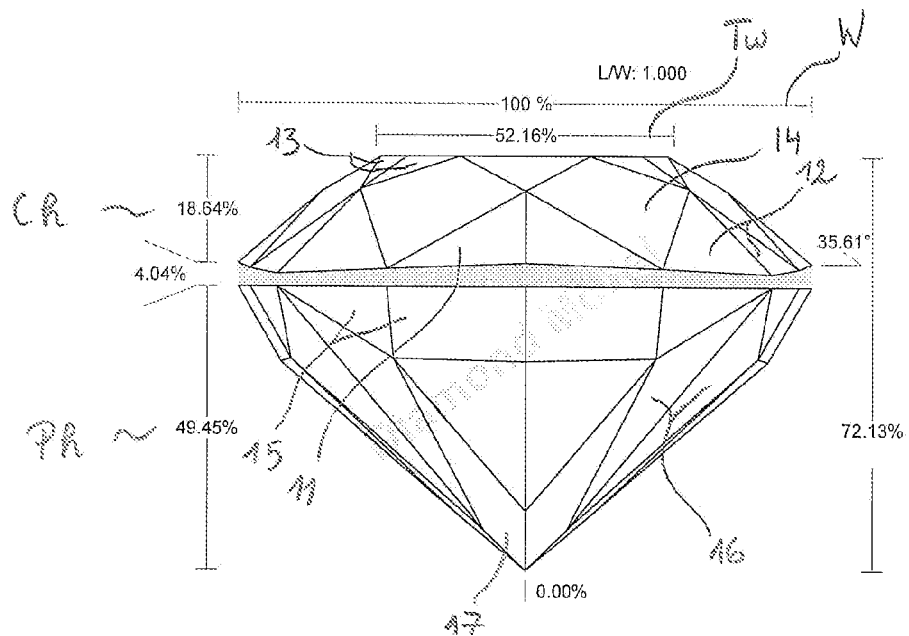
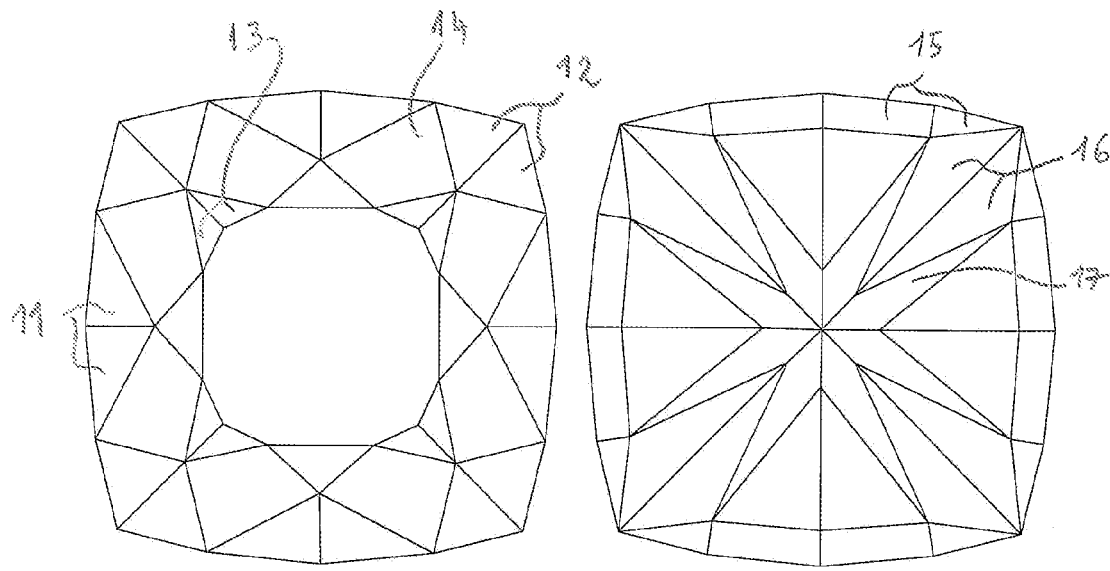
FIGURE 26

| For 1 carat stones (Mono Static) | | | | | Cushion Size Normalized by Square | | | | Cushion Size Normalized by Weight | | | |
|---|---|---|---|---|---|---|---|---|---|---|---|---|
| Cut name | Office, Black Background | ASET White | Intensity weighted dispersion (in mg) | Spread | Light Return Whole Crown Static | ETAS Fire Whole Crown Static | ETAS Fire Table only Static | ETAS Monochrome Whole Crown Static | DETAS Whole Crown Static | ETAS Fire Whole Crown Static | ETAS Fire Table only Static | ETAS Monochrome Whole Crown Static | DETAS Whole Crown Static |
| MSS Cushion 1 | | | | -22% | 0.96 | 1.04 | 0.95 | 1.05 | 1.10 | 0.92 | 0.88 | 0.97 | 1.02 |
| MSS Cushion 2 | | | | -17% | 1.11 | 1.01 | 0.83 | 1.15 | 1.22 | 0.92 | 0.76 | 1.07 | 1.15 |
| MSS Cushion 3 | | | | -12% | 1.08 | 0.95 | 0.90 | 1.09 | 1.09 | 0.89 | 0.86 | 1.04 | 1.05 |
| MSS Cushion 4 | | | | -21% | 1.06 | 1.09 | 1.06 | 1.29 | 1.35 | 0.98 | 0.95 | 1.19 | 1.25 |
| MSS Cushion 5 | | | | -27% | 1.09 | 1.04 | 1.10 | 1.31 | 1.36 | 0.93 | 0.98 | 1.18 | 1.24 |
| MSS Cushion 6 | | | | -23% | 1.01 | 1.38 | 1.79 | 1.11 | 1.22 | 1.24 | 1.65 | 1.02 | 1.13 |
| MSS Cushion 7 | | | | -20% | 1.04 | 1.59 | 1.30 | 0.95 | 1.55 | 1.48 | 1.22 | 0.89 | 1.45 |
| Commercially available Cushions | | | | | | | | | | | | | |
| Commercial square cushion cut 1 | | | | 20% | 1.04 | 1.02 | 0.93 | 1.03 | 1.05 | 0.95 | 0.87 | 0.96 | 0.98 |
| Commercial square cushion cut 2 | | | | 19% | 0.86 | 0.84 | 0.76 | 0.87 | 0.91 | 0.78 | 0.71 | 0.82 | 0.86 |
| Commercial square cushion cut 3 | | | | 18% | 0.77 | 1.08 | 0.12 | 0.84 | 0.78 | 1.01 | 0.11 | 0.79 | 0.74 |

FIGURE 27

| For 1 carat stones (Integral) | | | | Screen | Light Return Integral | Cushion Size Normalized by Square | | | Cushion Size Normalized by Weight | | |
|---|---|---|---|---|---|---|---|---|---|---|---|
| Cut name | Office, Black Background | ASET White | Intensity weighted dispersion (fire) | | | ETAS Fire Integral | ETAS Monochrome Integral | DETAS Integral | ETAS Fire Integral | ETAS Monochrome Integral | DETAS Integral |
| MSS Cushion 1 | | | | -22% | 0,94 | 0,93 | 1,03 | 1,03 | 0,87 | 0,96 | 0,97 |
| MSS Cushion 2 | | | | -17% | 1,09 | 0,93 | 1,09 | 1,15 | 0,88 | 1,04 | 1,10 |
| MSS Cushion 3 | | | | -12% | 1,06 | 0,90 | 1,07 | 1,08 | 0,86 | 1,03 | 1,04 |
| MSS Cushion 4 | | | | -21% | 1,04 | 1,01 | 1,18 | 1,23 | 0,95 | 1,11 | 1,17 |
| MSS Cushion 5 | | | | -27% | 1,00 | 1,01 | 1,09 | 1,14 | 0,92 | 1,01 | 1,06 |
| MSS Cushion 6 | | | | -23% | 0,99 | 1,22 | 1,10 | 1,22 | 1,13 | 1,03 | 1,15 |
| MSS Cushion 7 | | | | -20% | 1,01 | 1,26 | 0,93 | 0,98 | 1,18 | 0,87 | 0,92 |
| Commercially available Cushions | | | | | | | | | | | |
| Commercial square cushion cut 1 | | | | -20% | 0,96 | 0,96 | 1,00 | 1,00 | 0,89 | 0,93 | 0,94 |
| Commercial square cushion cut 2 | | | | -19% | 0,84 | 0,81 | 0,86 | 0,89 | 0,75 | 0,81 | 0,84 |
| Commercial square cushion cut 3 | | | | -18% | 0,72 | 0,63 | 0,64 | 0,61 | 0,59 | 0,60 | 0,57 |

FIGURE 28

| For 1 carat stones (Stereo Tilting) | | | | Spread | Light Return Whole Crown Stereo Tilting | Cushion Size Normalized by Square | | | Cushion Size Normalized by Weight | | |
|---|---|---|---|---|---|---|---|---|---|---|---|
| Cut name | Office, Black Background | ASET White | Intensity weighted dispersion (in mg) | | | ETAS Fire Whole Crown Stereo Tilting | ETAS Fire Table Only Stereo Tilting | ETAS Monochrome Whole Crown Stereo Tilting | ETAS Fire Whole Crown Stereo Tilting | ETAS Fire Table Only Stereo Tilting | ETAS Monochrome Whole Crown Stereo Tilting |
| MSS Cushion 1 | | | | -22% | 0,92 | 0,88 | 0,76 | 0,97 | 0,82 | 0,71 | 0,91 |
| MSS Cushion 2 | | | | -17% | 0,95 | 0,85 | 0,68 | 0,97 | 0,81 | 0,64 | 0,92 |
| MSS Cushion 3 | | | | -12% | 0,97 | 0,82 | 0,89 | 0,95 | 0,79 | 0,85 | 0,91 |
| MSS Cushion 4 | | | | -21% | 0,97 | 0,89 | 1,00 | 1,04 | 0,83 | 0,93 | 0,98 |
| MSS Cushion 5 | | | | -27% | 0,94 | 0,89 | 1,01 | 0,99 | 0,81 | 0,92 | 0,92 |
| MSS Cushion 6 | | | | -23% | 0,93 | 0,92 | 1,21 | 0,90 | 0,85 | 1,12 | 0,84 |
| MSS Cushion 7 | | | | -20% | 0,91 | 1,12 | 1,11 | 0,93 | 1,05 | 1,04 | 0,86 |
| Commercially available Cushions | | | | | | | | | | | |
| Commercial square cushion cut 1 | | | | -20% | 0,94 | 0,96 | 0,90 | 0,99 | 0,89 | 0,84 | 0,93 |
| Commercial square cushion cut 2 | | | | 19% | 0,90 | 0,81 | 0,83 | 0,86 | 0,75 | 0,77 | 0,81 |
| Commercial square cushion cut 3 | | | | 18% | 0,83 | 0,92 | 0,30 | 0,79 | 0,86 | 0,28 | 0,75 |

FIGURE 29

METHOD FOR DETERMINING A CUT FOR A GEMSTONE

CROSS-REFERENCE TO RELATED APPLICATIONS

The present application is a U.S. National Phase filing of International Application No. PCT/IB2012/051323, filed on Mar. 20, 2012, designating the United States of America and claiming priority to European Patent Application No. 11167969.2, filed May 27, 2011 and Belgian Patent Application No. 20110452, filed Jul. 14, 2011, and claims priority to and the benefit of all the above-identified applications, which are incorporated by reference herein in their entireties.

TECHNICAL FIELD

The present invention relates to the field of cut optimization for a gemstone.

SUMMARY OF THE INVENTION

The invention relates to a method for determining a cut for a gemstone. According to an embodiment the method comprises the following steps. First a generic shape for the cut is chosen. Next a plurality of cut designs having the selected generic shape is selected, e.g. a number of commercially available cut designs having the generic shape. Next a number of optical metrics are simulated for the plurality of cut designs using a number of simulation models having modeling coefficients. Based on the simulated optical metrics one or more cut designs of the plurality of cut designs are selected for further optimization. The geometry parameters for each selected cut design are varied within a range and a number of optical metrics are simulated for said range of geometry parameters. Based on the simulation results a further optimized cut design having optimized geometry parameters is determined. Next the gemstone is polished using the further optimized cut design having the optimized geometry parameters, whereupon the visual appearance of the polished gemstone is analyzed. On the basis of the analysis of the visual appearance the simulation models and/or the modeling coefficients may be adapted and/or the range for varying the geometry parameters may be changed and/or a cut design of the plurality of cut designs may be adapted, and/or one or more new cut designs may be added to the group of cut designs. Those steps may be repeated a number of times to increase the accuracy and performance of the method of the invention.

The generic shape may e.g. be any one of the following generic shapes: cushion, round, princess, emerald, asscher, oval, marquise, pear, radiant, heart.

The geometry parameters may include typical crown and pavilion parameters used to characterize the design cut. For a cushion this could e.g. be the crown angle, the pavilion main facets angle, the pavilion depth, the number of star facets, the lower facets depth, and other parameters as known by those skilled in the field.

The number of optical metrics may include any of or more of the following metrics: light return (brilliance), fire, scintillation, life, a lighting-independent probabilistic optical metric, a dark zone metric.

The light return or brilliance of a gemstone is a measure for the brightness of the stone in certain lighting conditions and will depend on the brightness and on the contrast. In other words, it is the capability of the gemstone to return a fraction of the incident light to the observer's eye together with appealing contrasting dispersed dark zones.

The fire of a gemstone is dependent on the brilliance and the dispersion (refraction). It is generally considered to be a measure for the capability of the diamond to disperse a white light into spectral iridescent colors perceived by the observer.

The life of a gemstone is dependent on the fire and the scintillation (the amount of "sparkle" as bright and dark zones flashing on and off) of the gemstone.

A dark zone metric is a metric qualifying the quantity of light that the cut reflects from the directions where there will be no light sources in real life. Dark zone analysis is based on the idea that it is necessary to model light from directions where there is no light in real life, such as regions obscured by an observer's head, body, and the background (the lower hemisphere beneath the girdle plane).

The lighting-independent probabilistic optical metric can e.g. be an effective total angular size metric which makes use of simulated light spots on a surface which are resulting from a calculation of a part of space which is visible through the cut design, said part of space being formed by a plurality of cones coming to an observer's eye through the cut design, each cone including a light source. The effective total angular size metric may comprise any one or more of the following: a monochrome effective total angular size taking into account the light spots, a fire effective total angular size taking into account only colored light spots, a dynamic effective total angular size taking into account the changing of the position of the light spots on the surface when the cut design is tilted. Other examples will be given in the embodiment illustrated in the figures.

According to a further embodiment the number of optical metrics may further include a grading metric taking into account any of or more of the following effects: fish-eye, nail head, light leakage, dark zones having a negative visual appeal.

The simulation models used to simulate the optical metrics preferably take into account the stereovision effect and/or optical limitations of the human eye such as light effects that are too small or too weak to be seen.

According to an embodiment, the analyzing visual appearance of the polished gemstone comprises fixing the gemstone face-up in a holder, and rocking the gemstone in various lighting environments to assess or measure light return, fire and life.

According to an embodiment the adapting of a cut design consists in adding or removing one or more facets of said cut design. The adding of a new cut design may consist in adding a cut design having a number of facets which differs from the number and placement of facets of each of the plurality of cut designs, e.g. by splitting a number of facets.

According to a further developed embodiment the simulating of a number of optical metrics for the plurality of cut designs using modeling coefficients, comprises simulating of a first number of optical metrics for a first zone of each cut design of the plurality of cut designs and a second number of optical metrics for a second zone thereof. These optical metrics will be described in detail in the description. For certain generic shapes or for particular cut designs of a generic shape, it could e.g. be decided to simulate the number of optical metrics for the table, on the one hand, and for the crown without table on the other hand.

The invention also relates to a computer program product comprising programming code for determining a cut for a gemstone, said programming code comprising instructions to perform one or more steps of any of the embodiments of the method disclosed above.

Further the invention relates to a stone manufactured from a (semi) precious stone material, more particularly from natural or synthetic diamond, said stone being cut and polished according to a cut determined using an embodiment of the method disclosed above.

The invention relates in particular to a stone according to any one of the claims 17-45. The cuts of the claims stones have the advantage that they perform better for the optical metrics, wherein the comparison is made using the optimized simulation models and modeling coefficient to calculate those optical metrics.

BRIEF DESCRIPTION OF THE FIGURES

The accompanying drawings are used to illustrate presently preferred non-limiting exemplary embodiments of the present invention. The above and other advantages, features and objects of the invention will become more apparent, and the invention will be better understood from the following detailed description when read in conjunction with the accompanying drawings, in which:

FIG. 5 is a table with the geometry proportions and Light Return/ETAS Fire metrics for different square cushion designs;

FIG. 6 is a Light Return/ETAS Monochrome diagram for the cut designs of the table of FIG. 5;

FIG. 7 illustrates the optimized CushionP design and shows bottom and top view of the cut design, a simulated photorealistic image and an ETAS diagram;

FIG. 16 is a table containing optical metrics (Mono) for polished Cushions 1-7 for 1 ct size stones;

FIG. 17 is a table containing optical metrics (Mono) for polished Cushions 1-7 for 10 ct size stones;

FIG. 18 is a table containing optical metrics (Stereo/Tilting) for polished Cushions 1-7 for 1 ct size stones;

FIG. 19 is a table containing optical metrics (Stereo/Tilting) for polished Cushions 1-7 for 10 ct size stones;

FIG. 24 illustrates schematically a first embodiment of a stone according to the invention;

FIG. 25 illustrates schematically a second embodiment of a stone according to the invention;

FIG. 26 illustrates schematically a third embodiment of a stone according to the invention;

FIG. 27 is a table containing optical metrics (Mono) for polished Cushions 1-7 for 1 ct size stones in comparison with three commercially available cushion cuts;

FIG. 28 is a table containing optical metrics (Integral) for polished Cushions 1-7 for 1 ct size stones in comparison with three commercially available cushion cuts;

FIG. 29 is a table containing optical metrics (Stereo/Tilting) for polished Cushions 1-7 for 1 ct size stones in comparison with three commercially available cushion cuts.

Figure 1A:
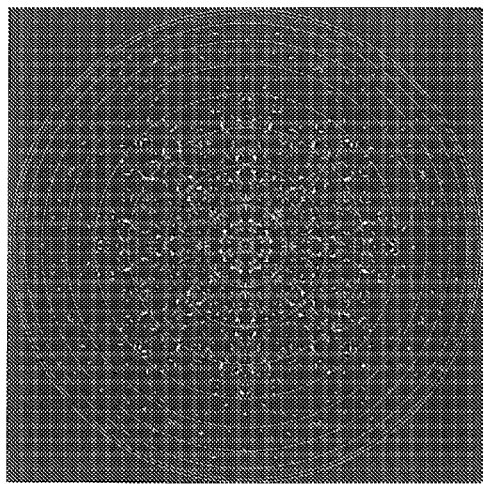
FIGS. 1A and 1B show an ETAS diagram and a DETAS diagram for a round brilliant cut (RBC)

Now an embodiment of the method of the invention will be illustrated in detail for a case where it is decided that it is desirable to have a cushion cut. However, the skilled person will understand that the method of the invention can be equally applied for other known generic shapes, such as a round, a pear, etc, and for new shapes. Generally the goal of an embodiment of the method of the invention is to find a cushion cut with maximal fire (typically at least greater than a Tolkowsky RBC) and about the same brilliance whilst avoiding negative phenomena such as dark zones, fish eye's, etc. The cut optimizations may be performed using software such as that sold by the company OctoNus for simulating e.g. the special optical metrics representing light return, contrast and fire, see further. Human stereo vision and optical limitations of the human eye are preferably taken into account. After optimization, the discovered optimized cut designs are cut and polished and viewed by expert observers. The subjective grade of the real stones from observers is further are taken into account to improve the next optimizations. An iterative process of those steps leads to continual design improvement resulting in an increasingly better performance. The best performing cuts may then be further optimized for commercial yield from rough diamonds. Computer-aided technology embodiments of the method of the invention allow for a reduction in the number of "Real Stone Cut Polishing—Cut Appraisal by human" iterations necessary to create a new cut with desirable optical appearance. The method allows a reduction of the time and financial cost for any new cut development as well as communication between geographically separated designers and developers.

Before describing in detail the different steps of an embodiment of the method of the invention, the optical metrics that can be used in the method of the invention will be described, as well as the simulation models that can be used to calculate those optical metrics.

Optical Metrics

Various light responses of a gemstone 3D model can be calculated. There are mainly three categories of relevant optical metrics:

responses directly perceived by the observer (scintillation, brilliance/light return, fire, wherein scintillation and fire determine the life of the gemstone);

negative grading by an observer ("fish-eye", "nail head", light leakage);

optical coefficients evaluating the cut regardless of the lighting and viewing conditions, such as the effective total angular size, see further.

The light return metric calculates the brightness of the stone in certain lighting conditions. Light return depends on the lighting conditions that are used for the calculation. The light return metric may e.g. be calculated through the Octo-Nus software called "Office". The lighting conditions in the simulation typically simulate a set of light sources that illuminate the diamond located in the upper hemi-sphere surrounding the diamond. The observer does not emit light to the stone. Also the viewing background for the stone is typically assumed to be black.

An optical coefficient which is independent of the lighting and viewing conditions is ETAS (Effective total angular size). ETAS is a simulation of a part of space that an observer can see through the diamond. An observer sees light in the diamond if a light source is placed within any cone coming to our eye through the diamond. The cones coming out of the virtual facets (VF) of the stone form the part of space calculated as ETAS. Each VF forms a 3D-spatial cone that comes out of the stone and goes ahead until it crosses a modeled light source surface (LSS) which the sources of light are assumed to be place upon. The LSS is usually assumed to be a sphere with the diamond in its centre. The intersection of the cones with the LSS forms the ETAS spots. The size of the spot will be determined by complex geometry factors such as the VF, the pupil diameter, etc. The spots can be characterized by the Fresnel Intensity, the latitude, the VF size, etc.

FIG. 1A shows an ETAS diagram where the position of the cones is shown placed on a sphere for a round brilliant cut (RBC). The distribution of the spots on the sphere will only be dependent on the optics of the cut itself and does not depend on any real lighting conditions. So the ETAS metric is a lighting-independent probabilistic metric. The spots will contain white and colored spots. The colored spots originated as a result of the dispersion of the diamond—rays with different colors (blue, green, red) have different refractive index, and thus follow a different path inside and outside the stone. Based on such an ETAS diagram a number of ETAS coefficients may be calculated to characterize the optics of the stone.

A first ETAS coefficient called ETAS Monochrome can be calculated as the sum of the areas of all the spots divided by the whole sphere squared. A bigger total area of spots on the ETAS diagram results in a bigger probability for the stone to reflect the light source to the observer's eye.

A second ETAS coefficient called ETAS Fire takes into account only the colored spots on the sphere and sums the area of such colored spots. ETAS Fire is e.g. calculated as the square of said sum divided by the total sphere area. If a white light source were to be placed on the sphere around the stone in the position of any colored spot on the ETAS diagram—the face up monoscopic observer will see a colored flash in the diamond caused by that light source.

Figure 1B:
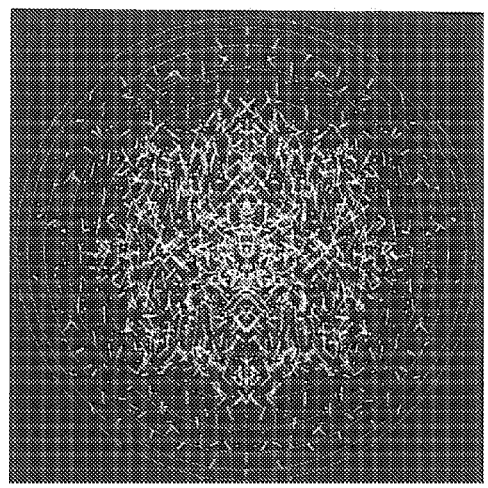

FIG. 1B illustrates a further dynamic ETAS diagram for a RBC in which the changing position of the spots on the sphere is shown when the diamond is tilted by 2 degrees. A tilting diamond "scans" a surrounding space and the probability to see the light source through the diamond increases with tilting. Depending on the light path in the stone, the spots related to the virtual facets will change position in a different way during the tilting. The longer the spot caused by the tilting—the bigger the probability that the facet will return a flash from a light source. The virtual facets that correspond to red lines on a DETAS diagram are those that scan the longest paths with a highest angular spread as the stone is tilting. They indicate the greatest potential for the diamond to view a light source during tilting. Blue shorter lines or dots have a much shorter path during tilting and green lines indicate an intermediate probability to reflect a light source.

This third coefficient called Dynamic ETAS or DETAS uses the sum of all the spot paths on the sphere while the stone is tilting. ETAS spots are moving across the sphere around the stone as the diamond is tilting. The area between the initial position of a monochromatic spot and its final position describes the Dynamic ETAS spot. So the "Red line" will have a bigger area between the initial and final position of monochromatic spot. Thus it gives bigger DETAS than "blue" or "green" lines. DETAS is calculated in the same way as ETAS metrics.

Note that light return and ETAS metrics could be calculated as absolute values and/or as relative values. For the ETAS coefficients the absolute metric values are a measure for the area on the sphere. The relative value is calculated as the absolute value for the metric divided by the absolute value for the same metric calculated in the same conditions for a Tolkowsky RBC. In the discussion below of an embodiment of the method of the invention relative values will be used. This means that a value greater than 1 means that the stone metric is higher than for a Tolkowsky RBC. The skilled person will understand that the method of the invention can also be implemented using absolute values or using another reference cut to calculate the relative values.

The optical metrics can be calculated for the face-up position of the stone and for a tilted stone. Also different zones of a cut can be taken in account—e.g. metrics can be calculated for the complete crown of the cut, for the table only, or for the crown without the table. Calculations can be done in "Mono" mode (Cyclops) without taking into account the stereovision effect or in "Stereo" mode (taking into account that an observer has two eyes). Further there may be provided an "Integral" mode providing an average metric for the "Static, complete crown" * "Static, table only" * "Tilting, complete crown" * "Tilting, table only".

Simulation Models

For a good performance of the method, it is necessary to use adequate simulation models of illumination, diamond, and observer. Preferably psychophysiological properties of human perception should be taken into account.

The calculation of the ETAS Fire metric preferably takes into account the factors such as real illumination source modeling and the physical size of the pupil.

In the GIA model (described at Reinitz I. M., Johnson M. L., Hemphill T. S., Gilbertson A. M., Guerts R. H., Green B. D., Shigley J. E. Modeling the Appearance of the Round Brilliant Cut Diamond: An Analysis of Fire, and More About Brilliance. Gems & Gemology, Vol. XXXVII, Fall 2001, pp. 174-197.) one substantially parallel white-light ray originating from an illumination source is used. The use of such ideal model has the disadvantage that the probability of observing a green ray is the same as that for any other color, whilst in real diamonds, green rays are observed much more rarely than blue and yellow rays. Further the GIA metric for dispersed color light return DCLR is almost independent of dispersion and fails to accurately model color light return.

Figure 2:
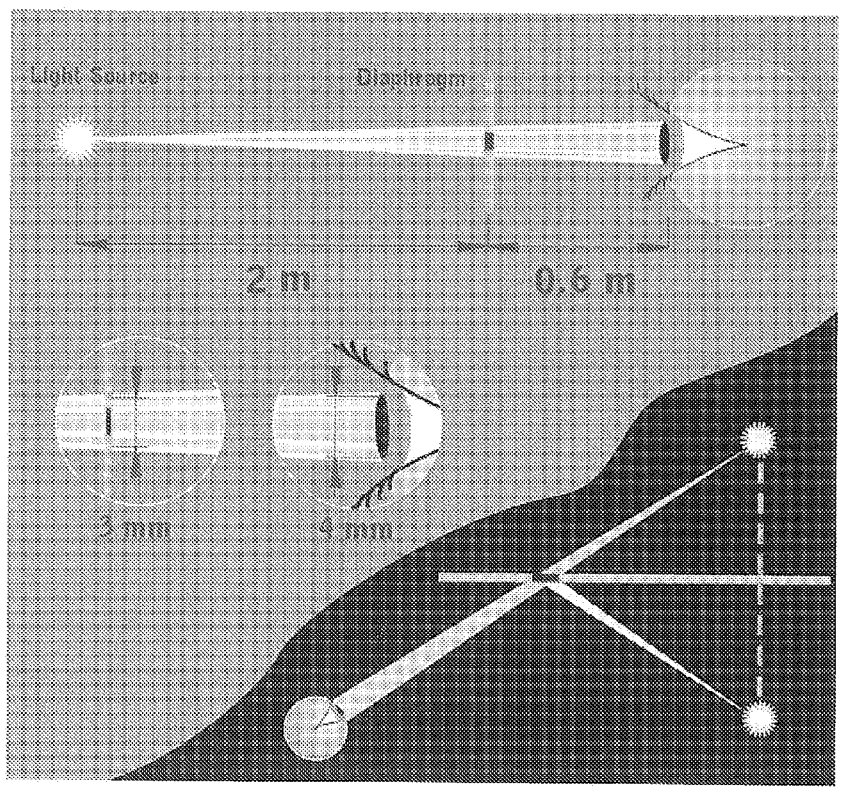
FIG. 2 illustrates an observer model showing that a diamond facet acts as an additional diaphragm to the pupil for a light source.

It was proved by real observations that an illumination source model with a convergence angle of the rays of about 6 degrees is close to real illumination and the model used in the method of the invention preferably takes into account this convergence angle, see http://www.gemology.ru/cut/english/grading1/5.htm The human eye has a pupil whose typical diameter is about 4 mm. This diameter may change, depending on the conditions of illumination. All the light entering the eye passes through the pupil. If the eye looks directly at a light source, the brightness of the source image formed on the retina is independent of the distance between the eye and the source, provided that the size of this image exceeds the effective size of a cluster of visual receptors in the retina. If there is an object, such as a diamond, between the eye and the source, its elementary prisms act as additional diaphragms. As a result, the light passing through such a prism may produce a source image with a considerably reduced brightness. The action of the elementary prisms depends on their size: a large prism hardly reduces the image brightness, while a very small prism may produce such a dim image that the eye fails to identify it as a separate object. The sizes of the elementary prisms depend on their quantity, the size of the stone, and the arrangement of its facets. Studying this problem allows one to determine the optimum combination of a light source and facet dimensions by numerical calculations. The interrelation between the source, one of the facets, and the eye pupil is illustrated in FIG. 2. In other words, if the light emitted by the source falls on a stone with a few large facets, the stone produces a few intense light beams; and if the light falls on a stone with many small facets, the stone produces many weak beams. When the number of the facets is large enough, the intensity of each of these beams tends to zero.

Figure 3:
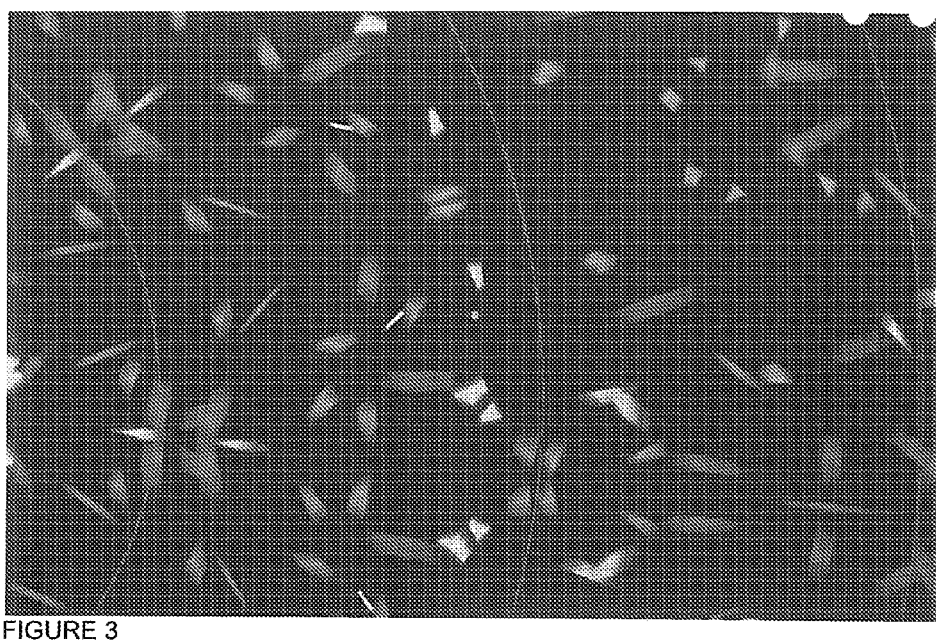
FIG. 3 shows an example of flashes with and without fire potential.

In an ETAS diagram the light flashes corresponding to different virtual facets can show more or less fire potential, see FIG. 3. A virtual facet that makes a white flash on the ETAS diagram will result in a white flash in the stone if the light source is located in that position on the sphere around the stone, while the virtual facet that gives a broad colored flash on the ETAS image has a higher possibility to give a colored flash. If the light source is large enough to cover the full ETAS colored flash for that facet, you would see a white color, but if the light source only partly covers the ETAS spot of the facet, the facet will give a colored flash.

To take into account those effects in the calculation of the ETAS Fire metric the contribution of any particular spot into the value of a metric can be generally written as:

(Spot area squared)×(Spatial weight)×(Additional weight)

Figure 3A:
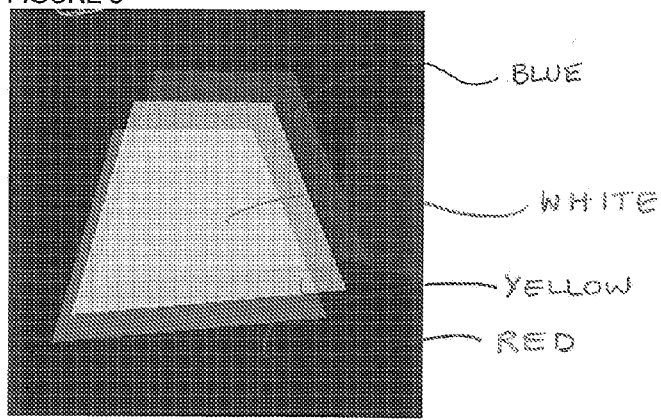

For each virtual facet the position of red and violet monochromatic ETAS spots can be determined separately because the Refraction index (RI) for red and violet light beams is different. It is possible to calculate the position of the ETAS spot on the sphere using the RI for red and for violet separately. The intersection of light spots from red to blue with similar intensity gives a white area, see FIG. 3A. If the light source will be located in the white area of the spot, the flash in the stone will be colorless. The spots of fire (assumed to be colored in some manner) are the whole color spot area minus the intersection of red and violet spots (white area). The spatial weight factor takes into consideration the location of the spot on an ETAS sphere, i.e. the "spatial location" of the ETAS spot.

Further, different parts of the space around the stone have different importance for diamond's appearance. Regions close to zenith will more probably hold sources of light than lower part of upper hemisphere. So generally more spatial weight should be assigned to spots closer to the zenith. The standard way to assign spatial weight to a spot is to add factor of $(\cos(\text{angle\_from\_zenith}))^n$ to the spot's contribution, where e.g. the default value of n is 2. Spots falling into the zone obstructed by a head are rejected from summation of the metric (thus effectively have zero spatial weight).

When summing the contributions for all the ETAS spots each ETAS metric can be calculated with different additional weighting functions that can increase or decrease the contribution of each particular spot in the total value. In the embodiment of the method below an "intensity and size weighting" function is used implying that the contribution of each ETAS spot is multiplied by its intensity and the virtual facets linear factors (representative for the VF size). A virtual facet has both an area and a length—an overall larger, or a wider virtual facet or a longer virtual facet will all have different performance as potential light returning diaphragms.

Influence of the Size of the Stone

Figure 4:
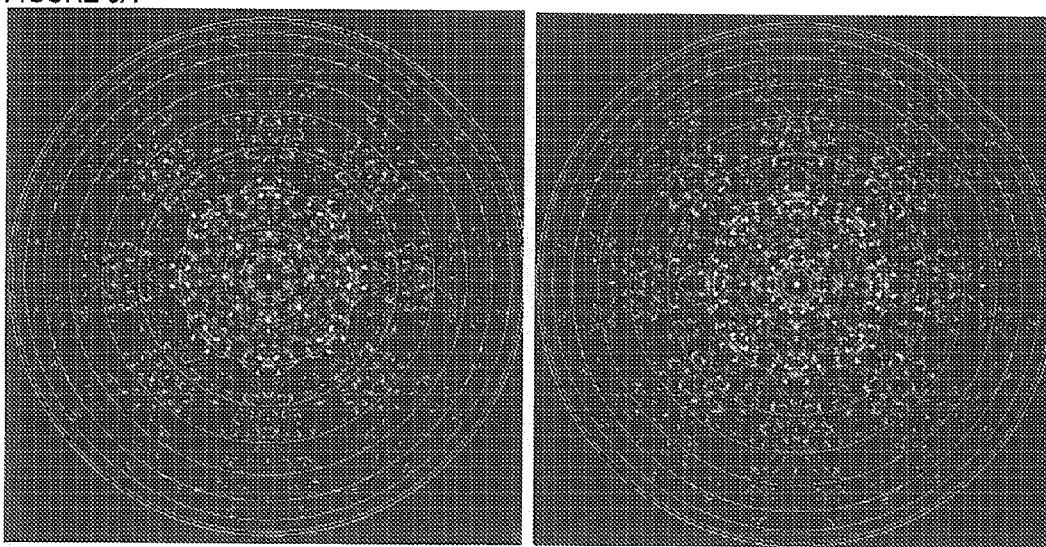
FIG. 4 shows ETAS diagrams for 1.00ct Tolkowsky RBC on the left and 10.00ct on the right.

FIG. 4 shows the larger number of spots resulting from larger virtual facets in a 10ct diamond (right) when compared to a smaller 1ct stone (left). Preferably the very small virtual facets in a smaller diamond that would be unable to be resolved by the eye would be ignored by the model used to calculate the ETAS metric, but a larger stone which has more discernible flashes should result in a larger ETAS value. Thus to compare two cuts it's necessary to make an adjustment for the size or weight.

Further it is also possible to make a weighting that accounts for different spreads. The spread parameter is a measure for the "massiveness" of a diamond crown surface compared to a standard diamond having e.g. Tolkowsky proportions with a medium girdle thickness. For example the American Gem Society (AGS) uses:

AGS Spread (ct)=$(D/6.47)^3-C$

AGS Spread (%)=$(1-C*(6.47/D)^3)*100\%$

C—weight of diamond (ct)
D—diameter of diamond (mm)
6.47—diameter in mm of diamond with weight 1 ct and Tolkowsky proportions.

A deeper diamond has a smaller spread, or a diamond with a thin girdle can have a larger spread or surface area for a given weight. In that case a 1.00ct RBC with the same raw ETAS as a given cushion cut of 1.20ct having a 20% smaller spread, can be weighted to result in the same adjusted ETAS value.

"Dispersion Statistics Diagram"—The Histogram of Fire Spatial Distribution

The ETAS fire metric accounts for the probability of a whole stone to show the fire. However to predict the distribution of high fire potential within a diamond a fire spatial distribution diagram called "Dispersion statistics diagram (diamond in ring)" is used. The diagram allows a check of the uniformity of the facets with high fire potential distribution. The "diamond in ring" is used by default allowing only light rays that can enter through the table and the crown facets to be taken into account.

It is also possible to calculate a "Chromatic dispersion" metric. For each virtual facet the "Chromatic dispersion" can be calculated as:

(dispersion angle)*(intensity)*(facet size)

Figure 11:
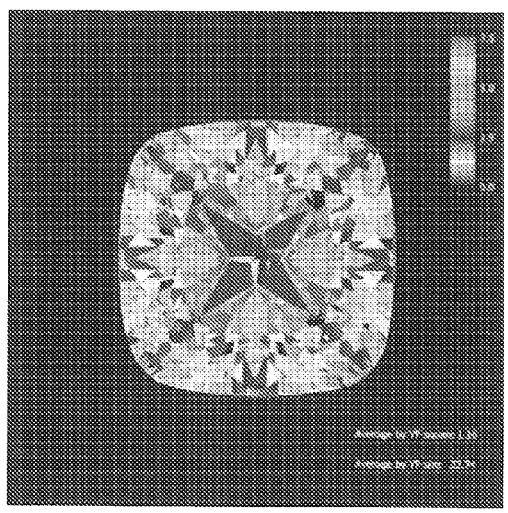
FIG. 11 shows a chromatic dispersion diagram for the "MSS Cushion 2"

When a white light path exits an optically dense medium it splits the colored rays because different wave lengths of light have different RI's in different transparent materials. The dispersion angle is an angle between blue and green rays. The dispersion of light also depends on the angle of incidence and the angle of exit as embodied in the example of dispersion created by a prism. "Chromatic dispersion" is a simplified metric that is used only to check fire distribution. The "Chromatic dispersion" metric does not take into account the real pupil size of the observer and so it cannot be used to estimate the overall fire of the stone. An example of a "Chromatic dispersion" diagram is shown in FIG. 11 which will be discussed further below.

The chromatic dispersion metric is the sum of chromatic dispersion results for all the stone virtual facets, normalized by total crown area or diameter, when we use linear size of facets in summation, instead of area. It could be considered as the Average Dispersion*Intensity.

Note that the calculated "Chromatic Dispersion" values are not relative, since the 1ct Tolkowsky RBC does not have an average by virtual facet of 1.00. Also, when tilting or seen in stereo the results can also be very different: the round diamond results increase through a wide range of titling and vary depending on the stones orientation. The cushion average by virtual facet falls considerably during tilting.

Chromatic dispersion has typically limited use during optimization because it does not take into account three features of the ETAS metrics: the observer's pupil size, the lights angular size and spatial weighting of the ETAS metrics sphere. Chromatic dispersion accounts for all dispersion angles whereas ETAS Fire accounts for only colorful areas. So chromatic dispersion is preferably not used for fire optimizations, because it will overestimate the fire for facets with very small dispersion angles. It is used mainly to determine the distribution across the stone, so for example it can be used to compare the table only from the crown only.

Now an embodiment of the method of the invention will be described in detail for determining an optimized cushion cut for a diamond.

Stage 1. Analysis of a Plurality of Square Cushion Cut Designs and the Selection of Optimized Cut Designs Fourteen types of cushion cut designs currently on the market were selected and analyzed by the following optical metrics which have been defined above:
Light return mono, indicted below as LRM;
ETAS monochrome (intensity and size weighted mono), indicated below as ETASM;
ETAS fire (intensity and size weighted mono), indicated below as ETASF;
ETAS Dynamic (only mono) (intensity and size weighted mono), indicated below as ETASD;

For each type of cut design a number of different cut designs having a different crown angle (Ca) and/or pavilion angle (Pa) were selected. The weight for the cushions was assumed to be about 1 ct.

The simulation results for the optical metrics for the fourteen cuts are summarized in the table of FIG. 5. Two types of cut designs showed the best optical performance: Cushion.P32C32B and CushionP. For each type of design, two cut designs were selected for further optimization. In the a Light Return—ETAS Monochrome diagram of FIG. 6 these four cut designs are marked with circles. The points represent the various analyzed cut designs. Since the Cushion.P32C32B model had limitations for parameter changes that cut was not selected for further optimization and Stage 2 below continues with the CushionP design. The CushionP design is illustrated in FIG. 7 which shows a schematic top and bottom view, a photorealistic image and the ETAS diagram of this cut design.

Stage 2. Macro-Optimization of Selected Cushion Cut Designs by Varying the Main Geometry Parameters The selected CushionP design was optimized using four main geometry parameters:

Crown angle (Ca)
Pavilion main facets angle (Pa)
Pavilion depth (Pd)
Star facets (Ib)
Two maximums were found:

|   | Pa | Ca | Ib | Pd | LRM | ETASM | ETASF | ETASD |
|---|------|------|----|-------|-------|-------|-------|-------|
| 1 | 38.6 | 10.2 | 80 | 46.5  | 1.029 | 0.916 | 0.768 | 0.971 |
| 2 | 38.8 | 9.8  | 80 | 46.75 | 1.023 | 0.912 | 0.722 | 0.962 |

Stage 3. Micro-Optimization by Further Varying Minor Geometry Parameters

Maximums found in the last optimization stage were optimized by further varying minor geometry parameters in addition to the main geometry parameters. Following parameters were used:
Crown height (Ch)
Pavilion main facets angle (Pa)
Lower facets depth (Io)
Two maximums were found:

|   | Pa   | Ch   | Io   | LRM   | ETASM | ETASF | ETASD |
|---|------|------|------|-------|-------|-------|-------|
| 1 | 38.6 | 10.0 | 80.0 | 1.017 | 0.889 | 0.723 | 0.931 |
| 2 | 35.0 | 14.0 | 75.0 | 0.827 | 1.025 | 1.256 | 1.131 |

The first set of geometry proportions was almost the same as found in the Stage 2 optimization. The second set of geometry proportions was different and showed high ETAS fire metrics. The second set of proportions was selected as a trial cut for polishing in Stage 4. This set of proportions was named "MSS Cushion 1".

Figure 8:
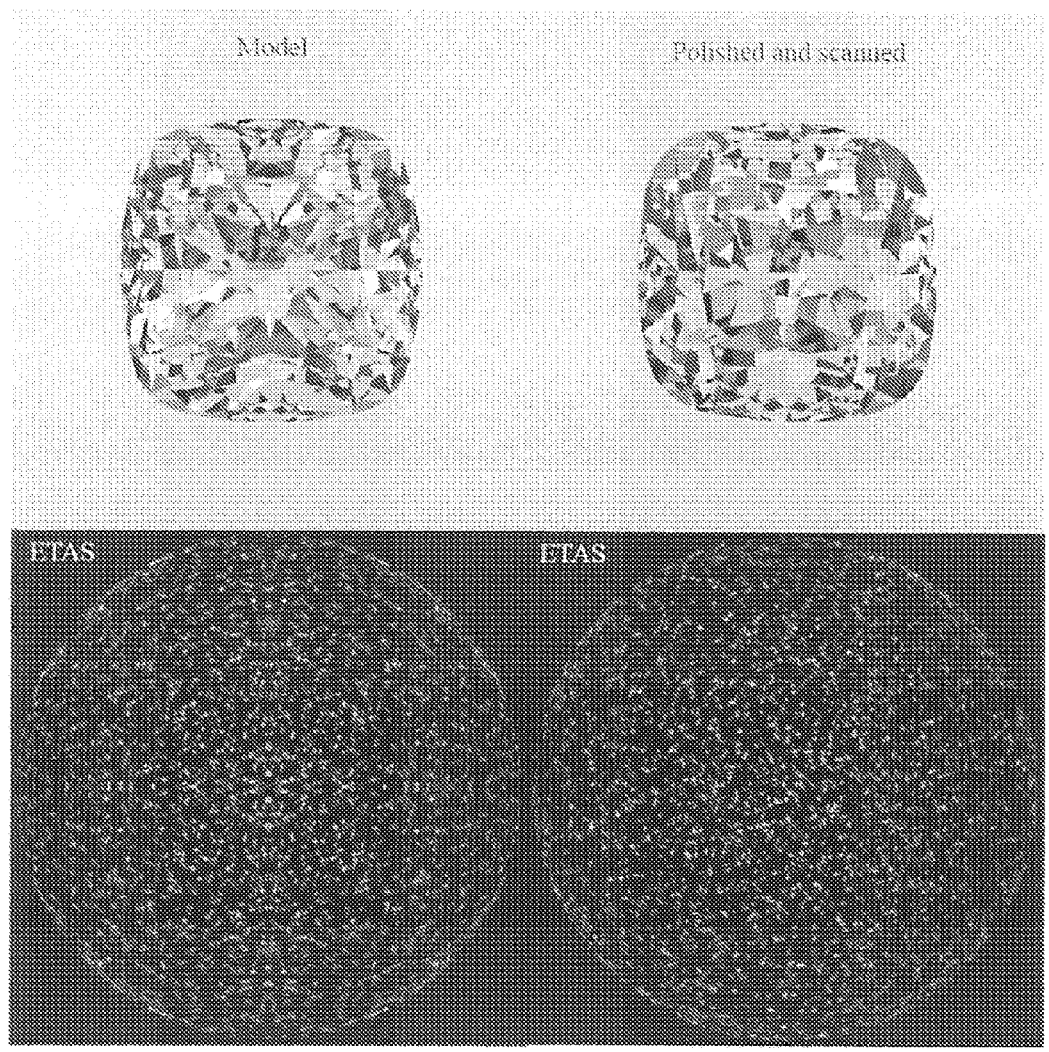
FIG. 8 show a simulated photorealistic image and an ETAS diagram of the "MSS Cushion 1" (also called Cushion 1) symmetrical model (left) and the scanned model or real polished Cushion 1 (right)

Stage 4. Polishing of the Optimized Cut Design and Comparison of Predicted and Polished Diamond "MSS Cushion 1" 0.55 ct was polished. A difference between predicted and polished diamond was found. In the polished stone the cushion girdle shape was not reproduced correctly and as result the main facets azimuths differed from the optimized cut design model. Also the size of the polished diamond was less than 1 ct. For comparison between the polished stone and the model, the simulated optical metrics were recalculated for a 0.55 ct diamond, and this both for the optimized symmetrical model and for scanned model (i.e. a model corresponding with the polished stone). The results are summarized in the table below and FIG. 8 shows the ETAS diagrams for the symmetrical model (left) and the scanned model (right).

| Metrics | Symmetrical model 0.55 ct | Scanned model 0.55 ct |
|---------|---------------------------|----------------------|
| LRM     | 0.84 | 0.75 |
| ETASM   | 0.78 | 0.75 |
| ETASF   | 0.93 | 0.89 |
| ETASD   | 0.86 | 0.74 |

The difference in metrics resulted mainly from girdle and main facets azimuths variations between the planned and the real polished stone.

Stage 5. Analysis of the Visual Appearance of Real Polished Diamond and Check for Any Negative Effects When comparing diamonds the following reflections can be made. For loose diamonds jewelers may place the stones being compared between two fingers on the back of your hand. The diamonds are rarely perfectly 'face up' and often slip about. The resulting preference could vary in repeated tests and body oils from the fingers can lead to the diamonds becoming dirty spoiling the results. Further jewelry store lighting is usually very bright and can mislead a buyer as to how the diamond will perform in other lighting or another jewelry store. Also, it is difficult to compare fancy cuts performance with known standards. The few existing standards for cut quality use different scales to compare different fancy cuts. Comparing the apparent size or surface area of different stones in different stores is difficult with stones that are not round or square.

Figure 9:
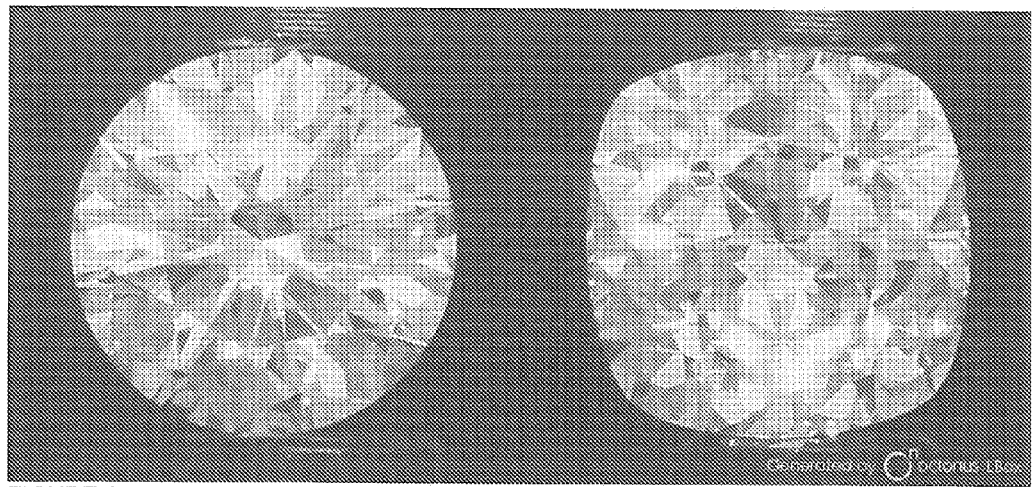
FIG. 9 shows an image of Tolkowsky AGS0 Hearts and Arrow round brilliant and of the cushion cut taken in a specially adapted lighting observation and photography box.

To simplify the comparison task applicant has developed a suitable box. This box is adapted for fixing the diamonds to be compared in face-up position with holders. Further the box may be provided with rocking means and with lighting means for creating various lighting environments (e.g. an environment to show brightness and another to show fire). The box also allows for comparing videos of fancy cuts, or in this case the cushion cut diamonds, with a known standard: e.g. the Tolkowsky AGS 0 Hearts and Arrow round brilliant. The stones are mounted side by side as shown in FIG. 9, and the rocking and the lighting is the same for both. Further the box may be adapted to record high quality stereo movies of the stones to reproduce the human stereo vision. If the stones to be compared have roughly the same surface area or carat weight then real consumer confidence becomes possible.

In FIG. 9 there is shown a screenshot of the movie registered by the box for a Tolkowsky round brilliant and the polished cushion cut. Also an analysis of visual appearance of the diamond is performed in a side by side comparison with Tolkowsky AGS 0 RBC in different lighting conditions. This analysis may be done by several experts and consumers. So both the movie comparisons as the direct comparisons help to analyze the visual appearance.

Analyzing the visual appearance resulted in the conclusion that the real polished Cushion 1 cut had the following negative features:
low light return (especially for the table). Leakage under the table is clearly visible;
low fire under the table;
long ray path for the facets under the table which can make the color appear lower.

Figure 10A:
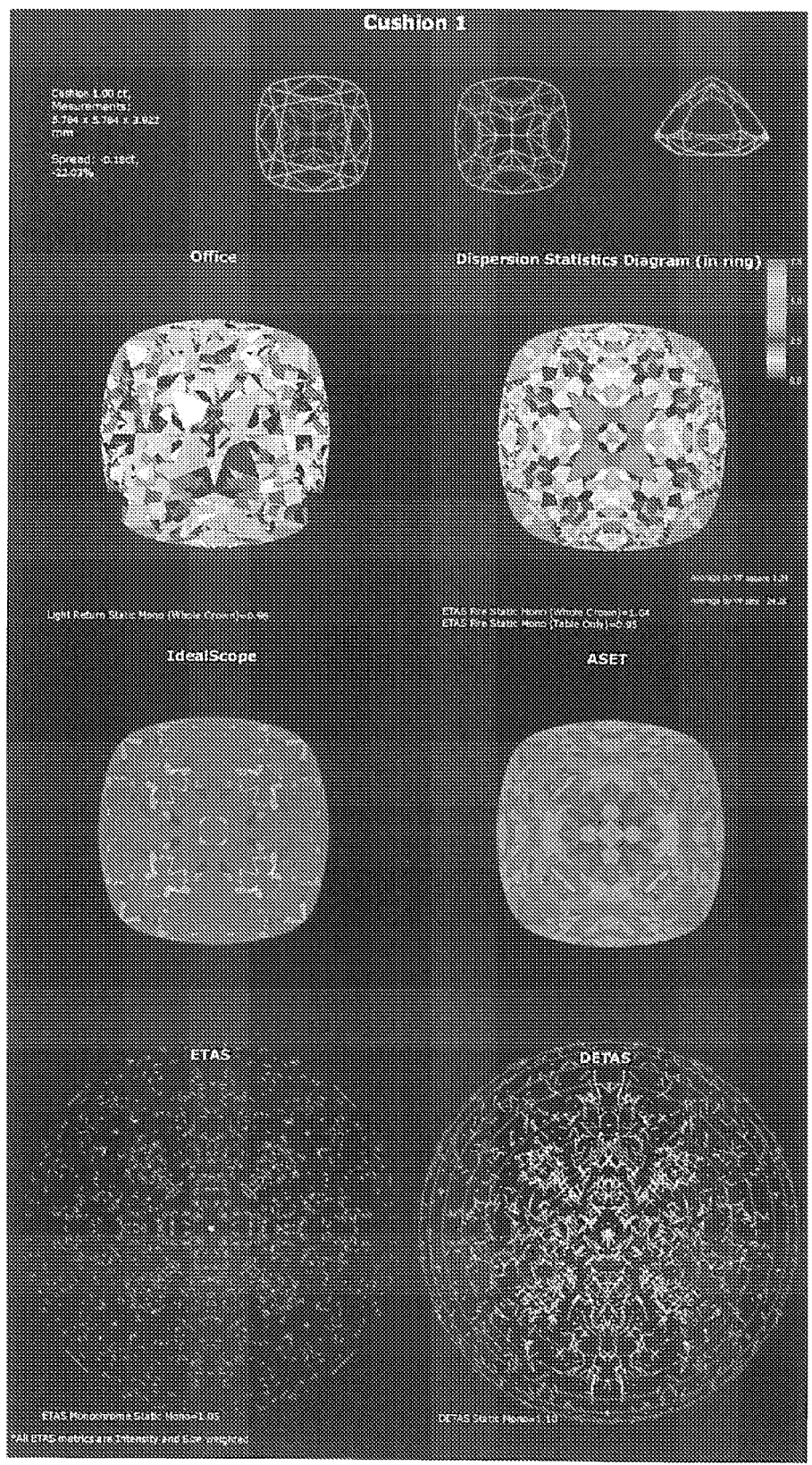
FIGS. 10A and 10B illustrate respectively the design cuts Cushion 1 and Cushion 2.

FIG. 10A shows a summary of the characteristics of the Cushion 1 cut design.

Stage 6. Further Optimizations, Polishing and Analyzing of Visual Appearance

Figure 10B:
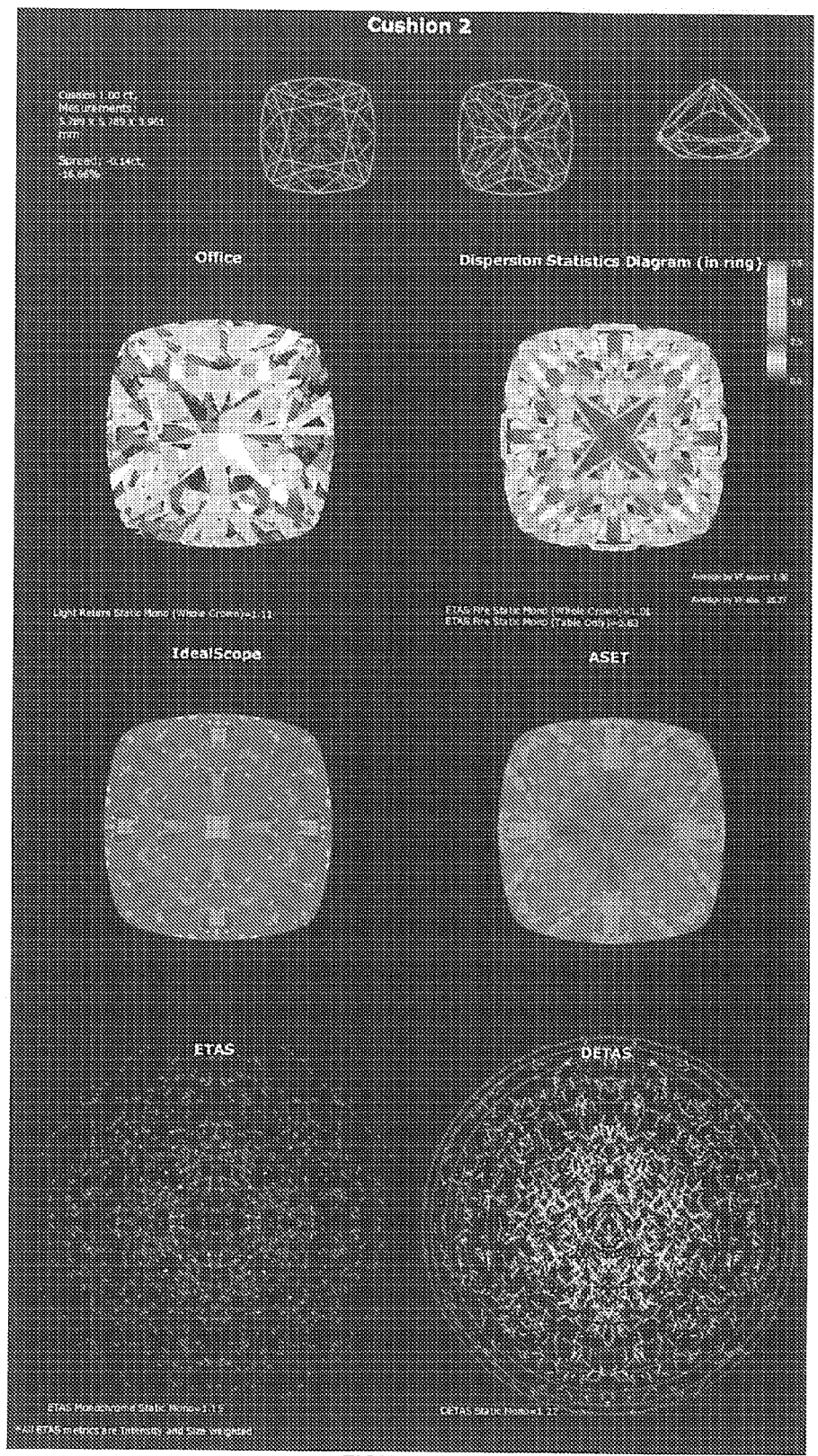

Since the disadvantages of "MSS Cushion 1" were clear and proved by visual observation from the analysis in Stage 5, it was decided to do a further optimization stage. The "MSS Cushion 1" set of geometry proportions was used as a starting point for a new optimization of the geometry parameters. This resulted in new geometry proportions and the corresponding cut design is called "MSS Cushion 2". The main characteristics of the cushion 2 cut design are illustrated in FIG. 10B. "MSS Cushion 2" was polished and checked manually by eye. The observers checked polished "MSS Cushion 2" and found the following advantages/disadvantages for the cushion:
high light return (main difference with "MSS Cushion 1");
no leakage under the table;
high fire for the crown facets;
low fire under the table ("MSS Cushion 2" inherits "MSS Cushion 1" negative feature, because both cushions have the same pattern).

FIG. 11 shows a chromatic dispersion diagram for the "MMS Cushion 2". It was observed that there is a diagonal cross under the table formed by the pavilion main facets. These facets have a lack of fire that was proven and confirmed by visual observation of the polished stone.

Stage 7. New Simulation Models for Cushion Optimizations

The understanding of "MSS Cushion 1" and "MSS Cushion 2" optics brings a new standard that Cushions should meet in addition to the metrics described in Stage 1. The conclusion is that better optimization results can be obtained if the diamond is divided in two zones (table and crown without table) where both zones should have a high light return and fire. In other words the simulation models used in Stage 1 should be adapted and allow for an optimization in different zones. In the present embodiment the model was changed to use the following metrics:
Light Return mono
ETAS Monochrome
ETAS Fire
ETAS Dynamic (only Mono) Intensity and Size weighted mono
Light Return mono—Table only
ETAS Fire Intensity and Size weighted mono—Table only Further it was concluded that a chromatic dispersion diagram should be taken in account in the simulation models to avoid big dull clusters (without fire).

Figure 12:
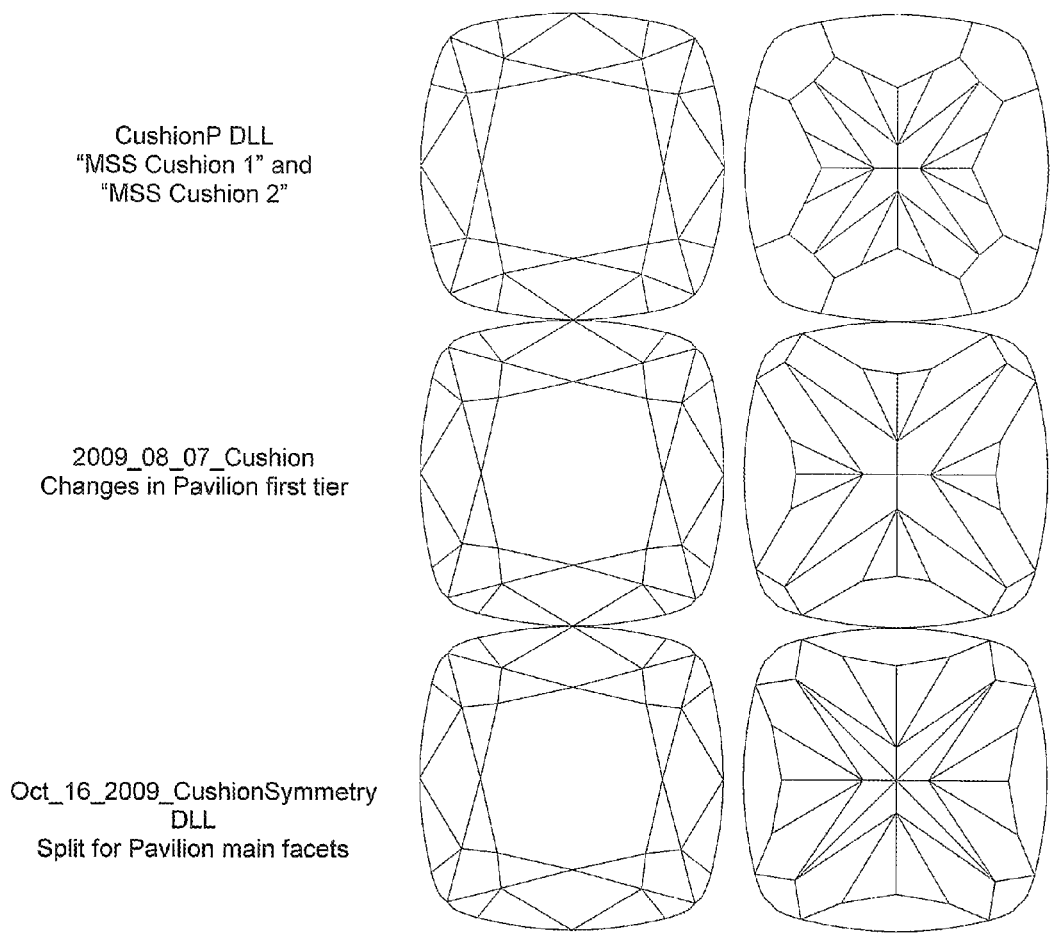
FIG. 12 illustrates the Cushion 1 and 2 designs as well as a number of newly added models.

Stage 8. Design or Pattern Modification Based on the Found Flaws of the Polished Stone "MSS Cushion 1" and "MSS Cushion 2" were based on the same CushionP DLL cut design. The lack of fire under the table is a permanent feature which is due to the pattern used in this cut design. Thus a pattern change is necessary to eliminate that negative feature. For the new stage of optimizations an improvement consisted in raising the capability of the cut parameters to change in wider range, see 2009_08_07_Cushion DLL in FIG. 12 where the geometry pavilion parameters have been significantly changed. Further a new cut design was added in which the main pavilion facets were split vertically, see Oct_16_2009_CushionSymmetry DLL in FIG. 13. The next stage of optimization will then use "MSS Cushion 2" and two new DLL designs as a starting point.

Stage 9. Optimization of Split-Facet Cushion

Figure 13:
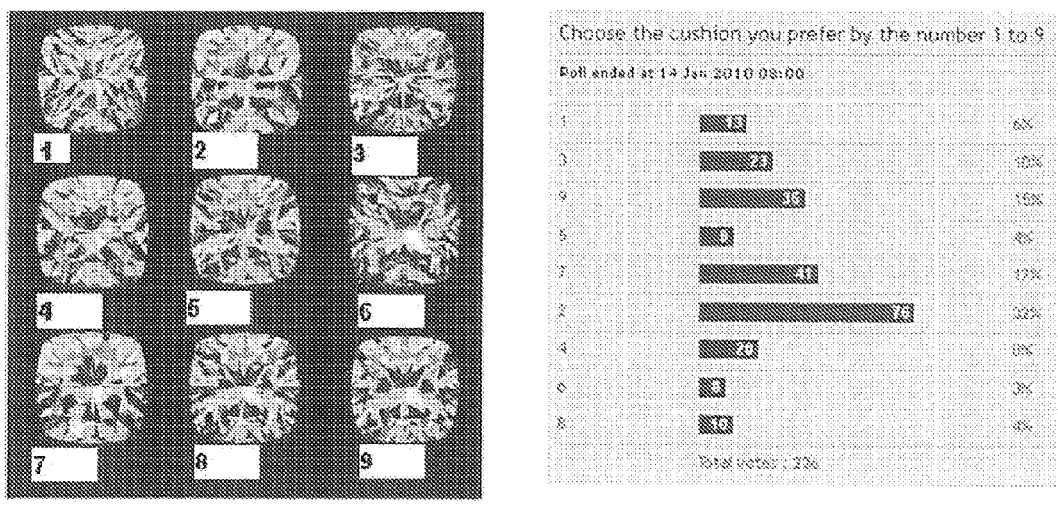
FIG. 13 illustrates the result of a consumer and expert voting between nine optimized design cuts.

The optimization of the cushion Oct_16_2009_CushionSymmetry DLL shown in FIG. 13 by varying the major and minor geometry parameters resulted in a list of peaks. The cut designs corresponding with the peaks are shown in FIG. 13. The selection of the cut design(s) to polish was done by voting by experts and consumers based on the simulated results for the cut designs of FIG. 13. "MSS Cushion 3" (corresponding with no 2 in FIG. 13) was selected by the poll above.

Figure 14:
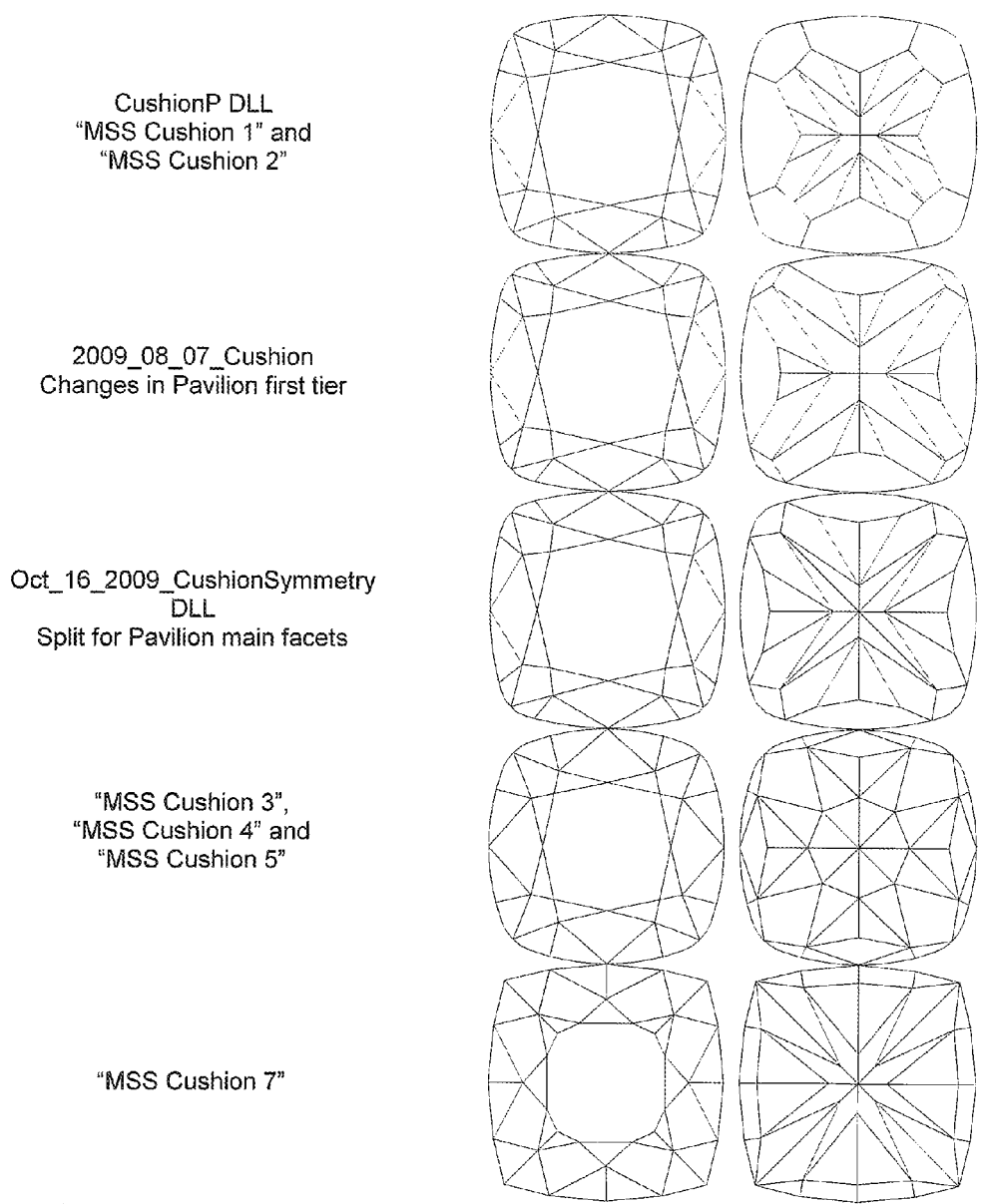
FIG. 14 illustrated the Cushion 1 and 2 designs as well as a number of newly added models and the further optimized designs Cushion 3, 4, 5 and 7.

After the "MSS Cushion 3" two other further optimized cut designs known as "MSS Cushion 4" and "MSS Cushion 5" were polished. The optimizations of "MSS Cushion 3-5" resulted in a further change of the cushion pattern as shown in FIG. 14. Also brillianteering was added to make the girdle thickness more uniform.

Figure 15:
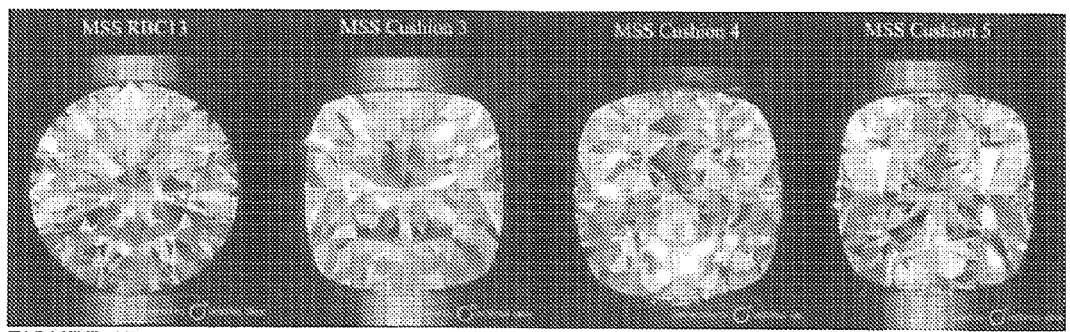
FIG. 15 shows images of a Tolkowsky RBC, a polished "MSS Cushion 3", "MSS Cushion 4" and "MSS Cushion 5" in a specially adapted lighting observation and photography box.

Stage 10. Analysis of the Visual Appearance of the Polished Split-Facet Cushions Polished "MSS Cushion 3", "MSS Cushion 4" and "MSS Cushion 5" were studied by different observers is various lighting environments and also compared in the above described box with the Tolkowsky RBC cut—see FIG. 15 which shows a Tolkowsky RBC, and the polished "MSS Cushion 3", "MSS Cushion 4" and "MSS Cushion 5" cuts.

It was found by visual observation that the Cushion 4 cut has more total fire and also more fire under the table. The overall observed brightness for Cushion 4 was higher than for RBC. However, the Cushion 4 girdle shape was noted by the observers as unusual: too round for the cushion which is considered to be unattractive. Cushion 3 and Cushion 5 have comparable total fire and brightness with RBC, but have less fire and brightness than Cushion 4. So the further optimization process was directed to the search of a cushion cut with a more popular girdle shape (like Cushion 3) and high fire and brightness values.

Stage 11. Optimization of the Split-Facet Cushion with Quadratic Girdle Shape

For the next cycle of optimizations further new cut designs were added. First the "MSS Cushion 6" was created. It differs from previous developed Cushions 3-5 by squarer girdle shape, larger table size and shallower pavilion, but it remains the pattern design of Cushions 3-5. Because of the larger table and new pavilion facets angles Cushion 6 resulted in a very high ETAS fire metric for the table area.

Stage 12. The Metrics Comparison for the Further Optimized Cushion Cuts

The main optical metrics that were directly used in the further optimization process for the cut designs Cushion 1 to 6 are shown on the FIG. 16. There are three main metrics:

Light Return Whole Crown Mono Static—the light return of the stone in face-up static position in comparison with Tolkowsky RBC. Light return more than 1.00 means that the cushion is brighter than a Tolkowsky RBC. Only Cushion 1 has a light return less than the Tolkowsky, Cushions 2-6 have a higher light return.

ETAS Fire Mono Whole Crown Static—an ETAS metric that represents the overall fire probability for the complete stone in comparison with a Tolkowsky RBC.

ETAS Fire Mono Table only Static—an ETAS metric that represents the fire probability for the path of the stone under the table. Cushions 1-3 have such a fire probability which is less than Tolkowsky. Cushions 4-5 have comparable ETAS Fire for the table area as a Tolkowsky RBC. Cushion 6 is characterized by a considerably higher ETAS Fire.

The ETAS metrics in the tables of FIG. 16 and following are calculated using two types of weighting:

by Square. In the illustrated calculations the cushions have the same surface area or spread as 1 ct Tolkowsky.

by Weight. Metrics in that part of the table are calculated for 1 ct cushions and weighted by 1 ct Tolkowsky.

Cushion 6 is characterized by a high ETAS Fire for the table area and high ETAS Fire for the whole stone.

After successive iterations based on the metrics and matching of the observations by observers, it is clear that the ETAS metrics are sensitive to the resolution of the eye—metrics calculated for 1 ct Cushion and weighted on 1 ct RBC will be different from the metrics calculated for 10 ct Cushion and weighted on 10 ct RBC. In the table of FIG. 17 are shown ETAS metrics for 10 ct cushion (normalized by square and by weight on RBC). The weighted ETAS Fire metrics for 10 ct cushion 6 (and some other cushions) are higher than for 1 ct cushion 6. This means that with weight increasing the cushion 6 fire rises more than RBC fire with the same size. The progress in metrics from Cushion 1 to Cushion 6 is clearly visible. The Cushion with high overall fire and high fire under the table were obtained during the continuous optimization process.

Stage 13. The Optimization Process for the Cushion in Stereo

Obtained Cushions 1 to 6 show the possibility to create a cushion cut with specified optical properties by a computer-aided optimization method. The Cushions 1-6 were optimized mainly for Mono optical metrics in a Static position of the stone. The next step in the optimization process is to develop the cushion cut that will be optimized for higher possible fire when viewed in stereo mode (by two eyes) and with tilting of the stone.

"MSS Cushion 7" was created by the optimization of the cushion cut by stereo metrics with tilting of the cut. To achieve the desirable result the pattern of Cushion 6 was changed by the modification of the crown main facets azimuths and splitting the corner pavilion facets, see FIG. 14. With optimizations by stereo/tilting ETAS metrics Cushion 7 proportions were found resulting in an ETAS Fire for stone tilting for the whole crown and table higher than Tolkowsky RBC, see the table of FIG. 18. Those stereo tilt ETAS Fire metrics take into account stereo vision of a human and the tilting of the stone by a real observer during the examination process.

Finally "Integral" metrics can be calculated as an average for the "Static, Whole Crown"*"Static, Table Only"*"Tilting, Whole Crown"*"Tilting, Table Only", see the table of FIG. 19.

Stage 14. The Best Performing Cuts are Optimized for Commercial Yield from Rough Diamonds Having arrived at a final optimal design the commercial practicality and viability should to be considered. A range of proportions that achieve a desirable result will enable the economic fitting of the desired shape into the available rough diamonds more effectively than a single proportion set.

There are several sets of facet relationships that can be varied which allow for a broader possible range of diamonds with the desired optical performance to be produced in a manufacturing setting. These parameters are programmed into rough diamond scanners and the most valuable outcome is predicted by the computer planning software.

Figure 20:
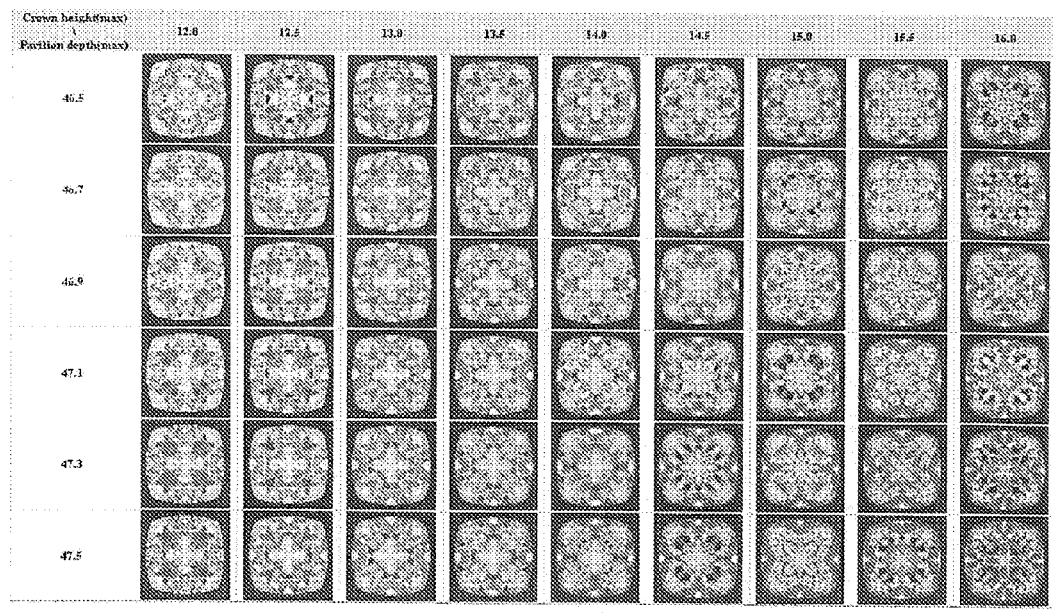
FIG. 20 is a table showing the representation potential for dispersion in a ring for selected crown height and pavilion depth ranges.
Figure 21:
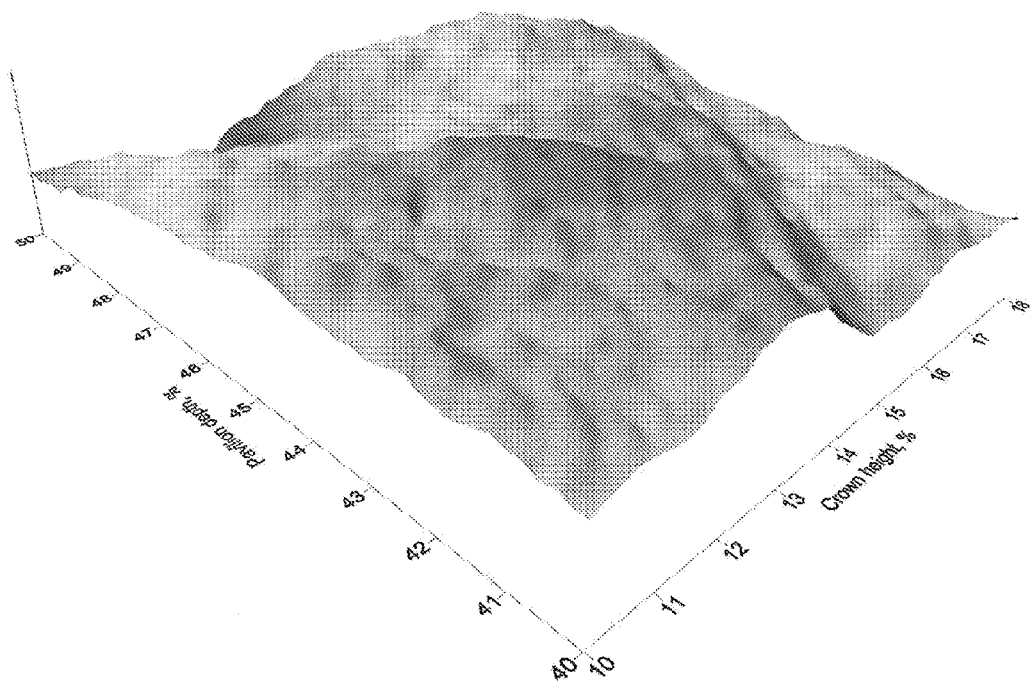
FIG. 21 is a 3D chart illustrating an optical metric in function of the pavilion depth and crown height.

FIG. 20 illustrates a simple example where only the crown height and pavilion depth have been varied. The selected presentation is for dispersion in a ring. All of the above mentioned metrics would also be computed for the example of parameter variations generated for the comparison example used in FIG. 20 and these could be represented as the 3D chart in FIG. 21 where there can be multiple peaks and ranges with good performance. This data can then be used to predict various parameters for ensuring the most beneficial weight for the planned polished stone model for each piece of a rough diamond.

Stage 15. The Difference Between the Real Polished Diamond and the Symmetrical Model of the Example of the Cushion 4

Figures 22, 23:
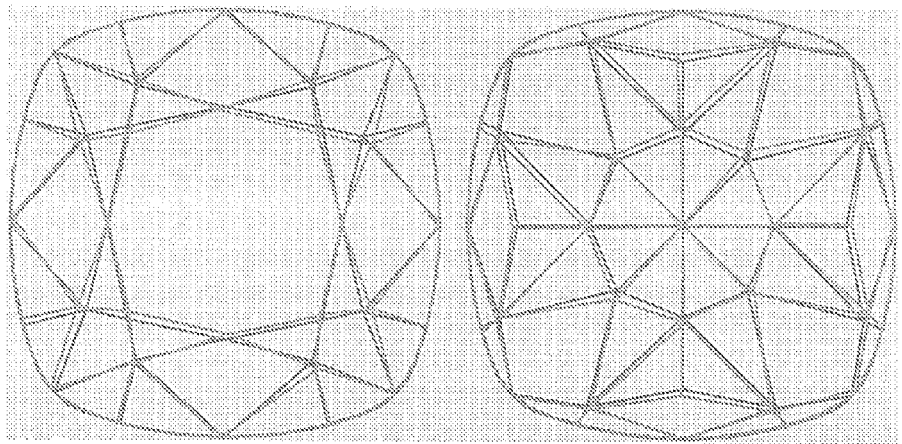
FIG. 22 shows the difference between the symmetrical Cushion 4 model and the scanned model of the real polished Cushion 4.
FIG. 23 shows a metrics comparison between the symmetrical model and the real polished Cushion 4 stone.

The Cushion 4 symmetrical cut design was used to polish a real diamond 1.02 ct. The real polished stone 1.02 ct will be analyzed using the 3D scanned model of the polished stone. The real polished stone always has a difference in angles/azimuths for the facets of same type, because of the limited precision of the cutting devices. However the technology of multistage parameters control helps to achieve very high accuracy for the cut. In FIG. 22 the difference in patterns between the symmetrical Cushion 4 model and the scanned model of the polished cut is shown. One observes that the girdle shape of the symmetrical and real cushions match closely. However some facet junctions on the crown and pavilion are slightly offset. The precision for main facets is better than 0.3 degrees. For minor facets the difference in angles between the symmetrical model and the real polished diamond are higher and can be up to 1.5 degrees.

For the azimuths the situation is comparable: for the main facets the repeatability is better than 0.5 degrees, for minor facets the difference can reach 3 degrees.

The comparison of the main metrics for the symmetrical model and the real polished Cushion 4 is shown in FIG. 23.

The light return metric is almost the same. Main ETAS metrics (ETAS Fire Whole Crown Static, ETAS Monochrome Whole Crown Static and DETAS Whole Crown Static) became slightly lower for the real polished cushion. Only the "ETAS Fire Table Only" metric significantly decreases for the real polished cushion.

Finally, it is noted that as part of the pricing methodology, it is possible to e.g. estimate the efficiency (beauty) and/or the efficiency of a cut using the ETAS metrics. This will allows comparing how effective the rough diamond material is used to achieve optical effects (Fire). Two types of weighting can be used: by Square, where the cushion ETAS metrics are weighed by Tolkowsky RBC metrics with the same square as the cushions; or by Weight, where cushion ETAS metrics are weighed by Tolkowsky RBC metrics with the same weight as the cushions.

FIGS. 24, 25 and 26 show a first, second and third embodiment of a stone of the invention. The cut of this stones corresponds with the above determined "Cushion 2" cut design, the "Cushion 4, 5, 6" cut design (Cushions 4, 5 and 6 use the same pattern but have different geometry parameters) and the "Cushion 7" cut design, respectively. The cut comprises a pavilion having a pavilion height Ph and a culet C; a crown having a crown height Ch, and a table T with a table width (Tw); and a girdle G between the pavilion and the crown.

In the embodiment of FIGS. 24 and 25, the crown comprises eight crown facets having a point adjoining the girdle. The eight crown facets comprise four main crown facets 1 being substantially symmetrically distributed around the girdle; and four corner crown facets 2, each corner crown facet being located between two of the main crown facets. Preferably the crown also comprises eight crown star facets 3 between the table and the crown facets. Further the crown comprises a number of further crown facets 8 having an edge adjacent the girdle and being located between a main crown facet and a corner crown facet 2. According to an optimized design the main crown facets 1 describe an angle relative to the plane of the girdle which is located between 31 and 36 degrees; and/or the corner crown facets 2 describe an angle relative to the plane of the girdle which is located between 28 and 36 degrees and/or the crown star facets 3 describe an angle relative to the plane of the girdle which is located between 18 and 26 degrees and/or the table width (Tw) is between 50 and 65% of the width W of the stone; and/or the crown height Ch is between 12 and 20% of the width W of the stone, preferably between 13 and 19%; and/or the pavilion height (Ph) is between 45 and 60% of the width (W) of the stone, preferably between 48 and 56%.

For the embodiment of FIG. 25 the pavilion comprises eight upper pavilion facets having a point adjoining the girdle, said eight pavilion facets comprising four main pavilion facets 4 being substantially symmetrically distributed around the girdle; and four corner pavilion facets 5. Each corner pavilion facet is located between two of the main crown facets. The pavilion further comprises a plurality of lower pavilion facets 6 adjoining the culet. Further there may be provided a number of additional facets 7 between the main pavilion facets 4 and the lower pavilion facets 6. Also there may be provided a number of facets 9 having an edge adjacent the girdle and adjacent a main or corner pavilion facet. According to a preferred cut the main pavilion facets 4 describe an angle relative to the plane of the girdle which is located between 55 and 58 degrees; and/or the corner pavilion facets 5 describe an angle relative to the plane of the girdle which is located between between 41 and 44 degrees; and/or the lower pavilion facets 6 describe an angle relative to the plane of the girdle which is located between 38 and 41 degrees.

For the embodiment of FIG. 24 the pavilion comprises eight upper pavilion facets having an edge adjoining the girdle. The eight upper pavilion facets comprising four main pavilion facets 25 being substantially symmetrically distributed around the girdle, and four corner pavilion facets 26, each corner pavilion facet being located between two main pavilion facets. The pavilion further comprises eight intermediate pavilion facets 28 having a point adjoining the girdle, each intermediate pavilion facet being located between a main pavilion facet and a corner pavilion facet; and a plurality of lower pavilion facets 27 adjoining the culet. According to a preferred embodiment the main pavilion facets 25 describe an angle relative to the plane of the girdle which is located between 55 and 63 degrees; and/or the corner pavilion facets 26 describe an angle relative to the plane of the girdle which is located between 50 and 58 degrees; and/or the lower pavilion facets 27 describe an angle relative to the plane of the girdle which is located between 35 and 41 degrees; and/or the intermediate pavilion facets 28 describe an angle relative to the plane of the girdle which is located between 38 and 44 degrees.

In the embodiment of FIG. 26, the crown comprises sixteen first crown facets having an edge adjoining the girdle. The sixteen first crown facets comprise eight main crown facets 11 being substantially symmetrically distributed around the girdle; and eight corner crown facets 12. Each corner has two corner crown facets which are being located between two of the main crown facets. The crown further comprises eight second crown facets 14 having a point adjoining the girdle and a point adjoining the table, each second crown facet being located between a corner crown facet and a main crown facet. The crown preferably comprises eight crown star facets 13 between the table and the corner crown facets. According a preferred embodiment the main crown facets 11 describe an angle relative to the plane of the girdle which is located between 38 and 43 degrees; and/or the corner crown facets 12 describe an angle relative to the plane of the girdle which is located between 36 and 42 degrees; and/or the crown star facets 13 describe an angle relative to the plane of the girdle which is located between 25 and 30 degrees; and/or the second crown facets 14 describe an angle relative to the plane of the girdle which is located between 35 and 41 degrees. Preferably the pavilion comprises sixteen upper pavilion facets 15 having an edge adjoining the girdle and being substantially symmetrically distributed around the girdle; eight corner pavilion facets 16 having a point adjoining the girdle and being substantially symmetrically distributed in the corners; and a plurality of lower pavilion facets 17 adjoining the culet. Preferably the upper pavilion facets 15 describe an angle relative to the plane of the girdle which is located between 57 and 63 degrees; and/or the corner pavilion facets 16 describe an angle relative to the plane of the girdle which is located between 36 and 42 degrees; and/or the lower pavilion facets 17 describe an angle relative to the plane of the girdle which is located between 37 and 43 degrees; and/or the table width Tw is between 50 and 60% of the width W of the stone; and/or the crown height Ch is between 16 and 21% of the width W of the stone; and/or the pavilion height Ph is between 45 and 55% of the width W of the stone.

The advantages of the cuts of the embodiments of FIGS. 24-26 are illustrated in FIGS. 27-30 which show the different ETAS metrics for Cushions 1-7 in comparison with three commercially available square cushion cuts. Especially for Cushion 6 (cut with pattern of FIG. 25) and Cushion 7 (FIG. 26) it can be observed that the ETAS metrics are significantly higher compared to prior art stones.

While the principles of the invention have been set out above in connection with specific embodiments, it is to be clearly understood that this description is merely made by way of example and not as a limitation of the scope of protection which is determined by the appended claims.

The invention claimed is:

1. A method for determining a cut for a gemstone, comprising the steps of:
    selecting a generic shape for the cut;
    selecting a plurality of cut designs of a group of cut designs having the selected generic shape;
    simulating a number of optical metrics for the plurality of cut designs using simulation models having modeling coefficients;
    selecting one or more cut designs of the plurality of cut designs based on the simulated optical metrics;
    varying the geometry parameters for each selected cut design within a range, simulating a number of optical metrics for said range of geometry parameters, and determining an optimized cut design having optimized geometry parameters based on the simulated number of optical metrics for said range;
    cutting and polishing of the gemstone using the optimized cut design having the optimized geometry parameters;
    analyzing the visual appearance of the polished gemstone;
    changing or adapting the simulation models and/or the modeling coefficients thereof and/or the range for varying the geometry parameters and/or a cut design of the plurality of cut designs, and/or adding one or more new cut designs to the group of cut designs, on the basis of the analysis of the visual appearance.

2. The method of claim 1, wherein the generic shape is any one of the following generic shapes: cushion, round, princess, emerald, asscher, oval, marquise, pear, radiant, heart.

3. The method of claim 1, wherein the generic shape is a cushion and wherein the geometry parameters include any one or more of the following parameters: crown angle, pavilion main facets angle, pavilion depth, number of star facets, lower facets depth.

4. The method of claim 1, wherein the number of optical metrics include any of or more of the following metrics: light return (brilliance), fire, scintillation, life, a lighting-independent probabilistic optical metric.

5. The method of claim 4, wherein the lighting-independent probabilistic optical metric is an effective total angular size metric using light spots on a surface which are resulting from a calculation of a part of space which is visible through the cut design, said part of space being formed by a plurality of cones coming to an observer's eye through the cut design, each cone including a light source.

6. The method of claim 5, wherein the effective total angular size metric comprises any one or more of the following: a monochrome effective total angular size taking into account the light spots, a fire effective total angular size taking into account only colored light spots, a dynamic effective total angular size taking into account the changing of the position of the light spots on the surface when the cut design is tilted.

7. The method of claim 1, wherein the number of optical metrics include a grading metric taking into account any of or more of the following effects: fish-eye, nail head, light leakage.

8. The method of claim 1, wherein the simulation models used to simulate the optical metrics are adapted to take into account the stereovision effect and/or optical limitations of the human eye.

9. The method of claim 1, wherein the analyzing of the visual appearance of the polished gemstone comprises fixing the gemstone face-up in a holder, measuring the gemstone in a static situation and measuring the gemstone whilst rocking the gemstone in various lighting environments in order to measure a set of optical metrics.

10. The method of claim 9, wherein the measured set of optical metrics comprises any one or more of the following metrics: light return, fire and life.

11. The method of claim 1, wherein the adapting or changing of a cut design consists in adding or removing one or more facets of said cut design.

12. The method of claim 1, wherein the adding of a new cut design consists in adding a cut design having a number of facets which differs from the number of facets of each of the plurality of cut designs.

13. The method of claim 1, wherein the adding of a new cut design consists in adding a new cut design which differs from the optimized cut design in that it has split facets.

14. The method of any of the previous claim 1, wherein the simulating of a number of optical metrics for the plurality of cut designs using modeling coefficients, comprises simulating of a first number of optical metrics for a first zone of each cut design of the plurality of cut designs and a second number of optical metrics for a second zone thereof.

15. The method of claim 1, wherein the steps are repeated a number of times for the same generic shape of the cut.

* * * * *